(12) United States Patent
Tanaka

(10) Patent No.: US 11,075,241 B2
(45) Date of Patent: Jul. 27, 2021

(54) SOLID-STATE IMAGING DEVICE AND ELECTRONIC APPARATUS

(71) Applicant: SONY SEMICONDUCTOR SOLUTIONS CORPORATION, Kanagawa (JP)

(72) Inventor: Harumi Tanaka, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 24 days.

(21) Appl. No.: 16/496,730

(22) PCT Filed: Mar. 16, 2018

(86) PCT No.: PCT/JP2018/010377
§ 371 (c)(1),
(2) Date: Sep. 23, 2019

(87) PCT Pub. No.: WO2018/180569
PCT Pub. Date: Oct. 4, 2018

(65) Prior Publication Data
US 2020/0035730 A1     Jan. 30, 2020

(30) Foreign Application Priority Data
Mar. 30, 2017 (JP) .............................. JP2017-067654

(51) Int. Cl.
*H01L 27/146* (2006.01)
*F21V 8/00* (2006.01)

(52) U.S. Cl.
CPC ...... *H01L 27/14623* (2013.01); *G02B 6/0011* (2013.01); *H01L 27/14605* (2013.01);
(Continued)

(58) Field of Classification Search
CPC ......... H01L 27/14605; H01L 27/14623; H01L 27/14625; H01L 27/14627; H01L 27/1464;
(Continued)

(56) References Cited

U.S. PATENT DOCUMENTS

| 2005/0045928 A1* | 3/2005 | Kuriyama | ......... H01L 27/14629 257/294 |
| 2005/0161584 A1* | 7/2005 | Tanaka | .............. H01L 27/14625 250/208.1 |

(Continued)

FOREIGN PATENT DOCUMENTS

| JP | 2001-223846 A | 8/2001 |
| JP | 2005-072662 A | 3/2005 |

(Continued)

OTHER PUBLICATIONS

International Search Report and Written Opinion of PCT Application No. PCT/JP2018/010377, dated May 1, 2018, 16 pages of ISRWO.

*Primary Examiner* — Stephen W Smoot
(74) *Attorney, Agent, or Firm* — Chip Law Group

(57) ABSTRACT

The present technology relates to a solid-state imaging device that includes a sensor substrate having at least a first pixel region and a second pixel region, and a light shielding body substrate which is stacked on an upper surface of the sensor substrate and has a light shielding body surrounding a plurality of light guide paths, in which the plurality of light guide paths includes at least a first light guide path corresponding to the first pixel region, and a second light guide path corresponding to the second pixel region, a plurality of pixels included in the first pixel region has a light shielding structure based on respective pixel positions in the first pixel region, and a plurality of pixels included in the second pixel
(Continued)

region has a light shielding structure based on respective pixel positions in the second pixel region.

13 Claims, 23 Drawing Sheets

(52) U.S. Cl.
CPC .. *H01L 27/14625* (2013.01); *H01L 27/14627* (2013.01); *H01L 27/14643* (2013.01); *H01L 27/1464* (2013.01)

(58) Field of Classification Search
CPC .. H01L 27/14643; G02B 6/0011; G02B 6/003
See application file for complete search history.

(56) References Cited

U.S. PATENT DOCUMENTS

| | | | | |
|---|---|---|---|---|
| 2010/0220226 | A1* | 9/2010 | Wang | H01L 27/1464 |
| | | | | 348/294 |
| 2016/0276394 | A1* | 9/2016 | Chou | H01L 27/14621 |
| 2019/0035838 | A1* | 1/2019 | Byun | H01L 27/14621 |
| 2019/0131327 | A1* | 5/2019 | Chou | H01L 27/1464 |
| 2020/0356748 | A1* | 11/2020 | Wang | H01L 51/5284 |

FOREIGN PATENT DOCUMENTS

| | | |
|---|---|---|
| JP | 2010-091864 A | 4/2010 |
| WO | 2016/208403 A1 | 12/2016 |

* cited by examiner

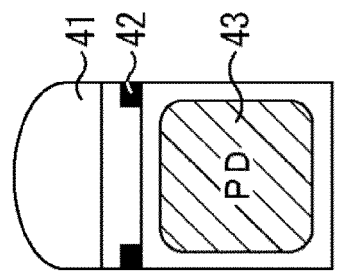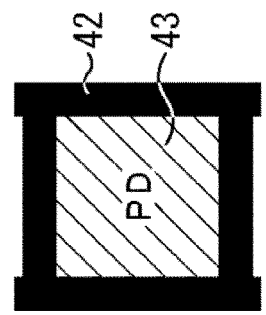
FIG. 4A
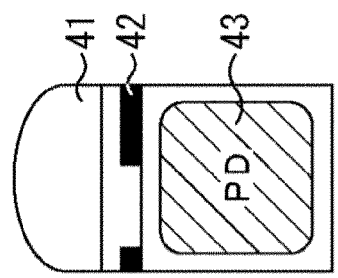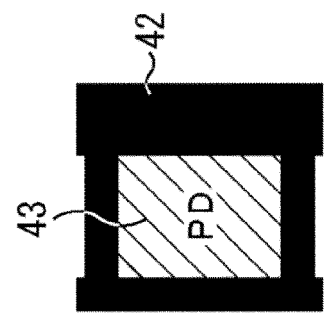
FIG. 4B
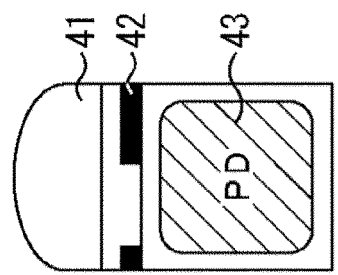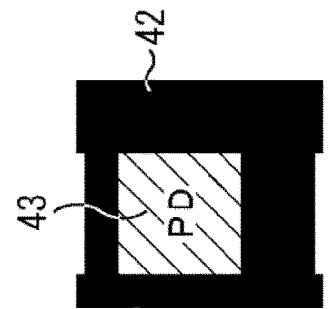
FIG. 4C

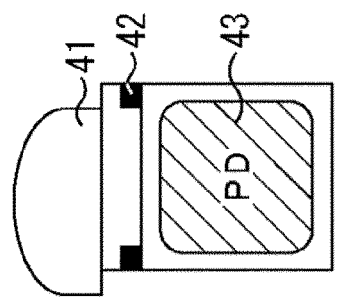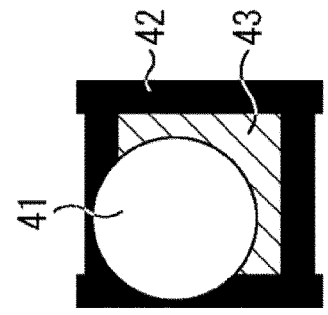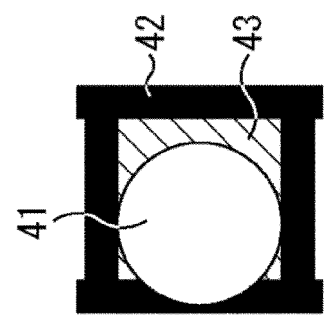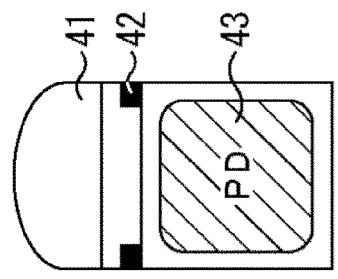
FIG. 5A  FIG. 5B  FIG. 5C

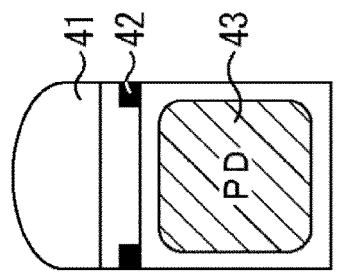
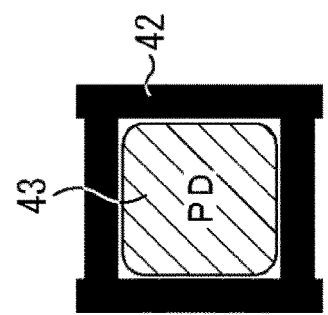
FIG. 6C
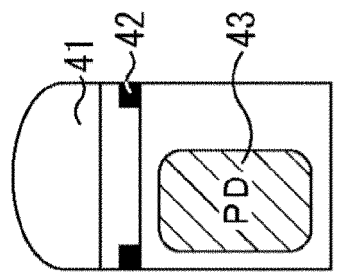
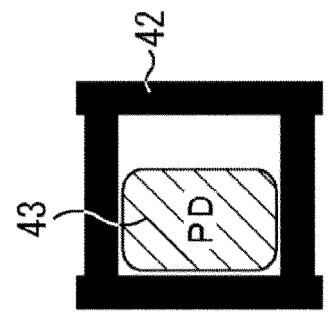
FIG. 6B
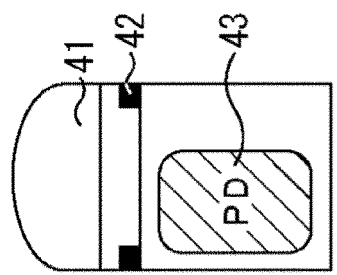
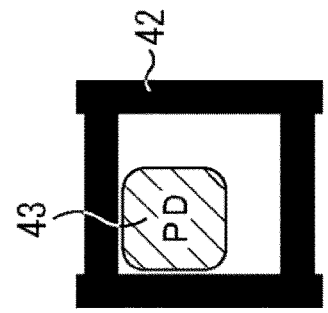
FIG. 6A

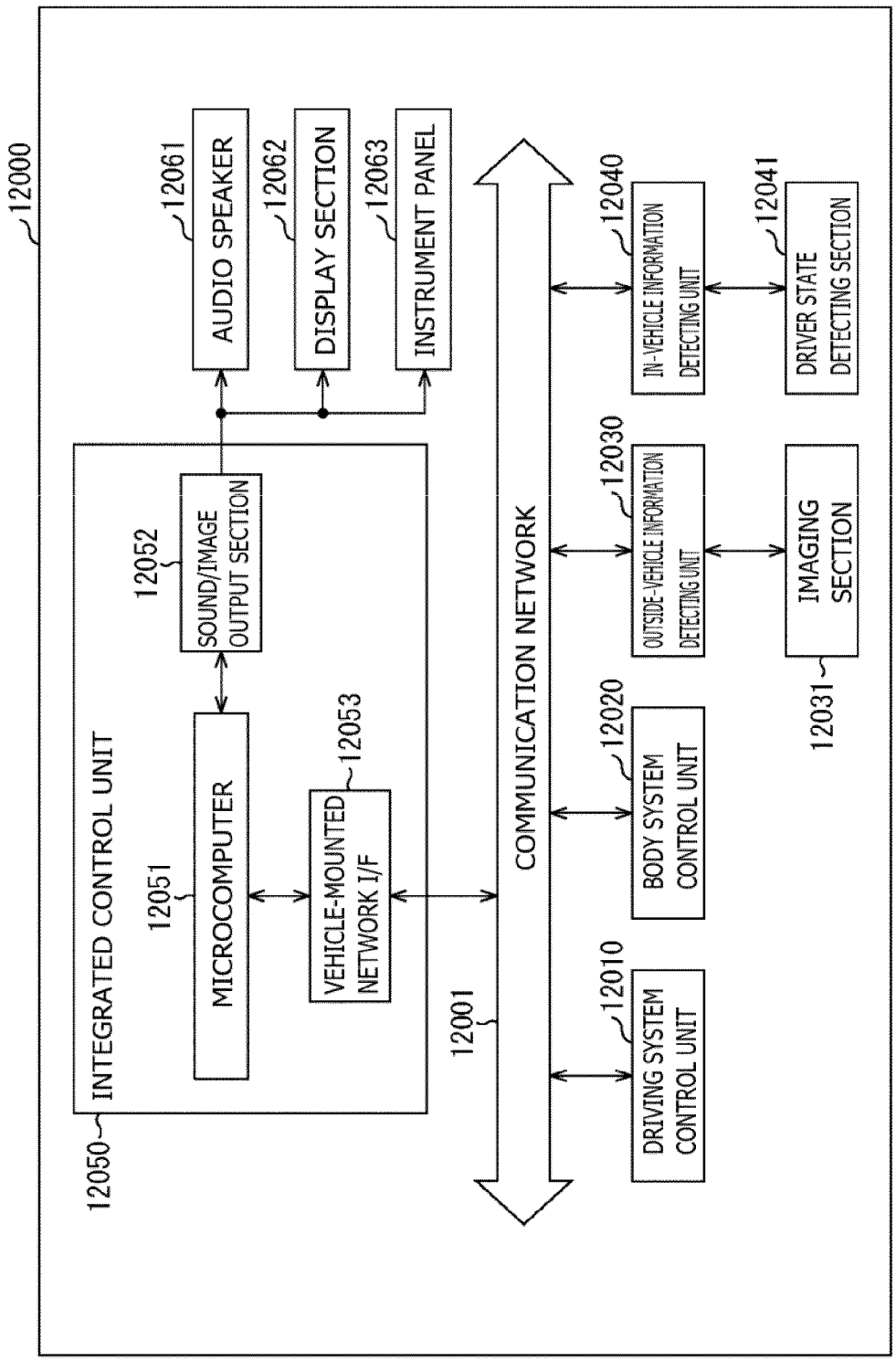
F I G . 2 2

SOLID-STATE IMAGING DEVICE AND ELECTRONIC APPARATUS

CROSS REFERENCE TO RELATED APPLICATIONS

This application is a U.S. National Phase of International Patent Application No. PCT/JP2018/010377 filed on Mar. 16, 2018, which claims priority benefit of Japanese Patent Application No. JP 2017-067654 filed in the Japan Patent Office on Mar. 30, 2017. Each of the above-referenced applications is hereby incorporated herein by reference in its entirety.

TECHNICAL FIELD

The present technology relates to a solid-state imaging device and an electronic apparatus, particularly to a solid-state imaging device and an electronic apparatus which are preferable when used in the case where a light shielding body substrate is stacked on an upper surface of a sensor substrate.

BACKGROUND ART

In the past, there has been known a solid-state imaging device in which a light shielding body substrate is stacked on an upper surface of a sensor substrate formed with a CMOS image sensor or the like (see, for example, PTL 1).

FIGS. 1A and 1B depict an example of an existing configuration of a solid-state imaging device in which a light shielding body substrate is stacked on an upper surface of a sensor substrate, in which A of the figure is a vertical sectional view, and B of the figure is a horizontal sectional view taken along line segment X-X' depicted in A of the figure.

A sensor substrate 10 is, for example, a back side illumination type CMOS image sensor or the like, in which a plurality of pixels is arranged in a matrix pattern in a pixel array. Each of the pixels is provided with a PD (photodiode) that generates electric charges according to incident light, and an OCL (on-chip lens) that causes the light to be incident on the PD.

A light shielding body substrate 20 includes light shielding bodies 23, and light guide paths 24 formed in a columnar shape between the light shielding bodies 23, with a microlens 21 formed on an upper surface (incident surface) side of each light guide path 24. In addition, a lower surface side of the light guide path 24 faces toward the pixel array of the sensor substrate 10.

A front light shielding body 22 for restraining incidence of unrequired light may be formed in a region of the light guide path 24 on the incident surface side of the light shielding body substrate 20 which region is not covered by the microlens 21.

In a pixel region 11 of the sensor substrate 10 corresponding to each light guide path 24, a plurality of pixels (for example, approximately 100 pixels by 100 pixels) is disposed, though depending on the size of the light guide path 24. Note that a pixel region 12 of the sensor substrate 10 corresponding to the light shielding body 23 is made to be an OPB (Optical Black) region, and a pixel signal of the pixels disposed in the OPB pixel region (OPB region) 12 is used, for example, for correction of a pixel signal of the pixels disposed in the pixel region 11 corresponding to the light guide path 24, without being subjected to signal processing by a logic circuit at the subsequent stage.

CITATION LIST

Patent Literature

[PTL 1]
WO2016-208403

SUMMARY

Technical Problem

FIG. 2 depicts optical paths of incident light in one light guide path 24 of the solid-state imaging device illustrated in FIGS. 1A and 1B. Note that solid lines in the figure depict optical paths of light to be received by the pixel region beneath the light guide path 24, while the light paths of broken lines in the figure are optical paths of stray light not to be received by the pixel region beneath the light guide path 24.

In other words, the stray light not to be received by the pixel region beneath the light guide path 24 is light to be originally incident on other light guide path 24 adjacent to the above-mentioned light guide path 24. The stray light is incident on the light guide path 24 from an oblique direction, is reflected by a wall of the light shielding body 23, and is then received by the pixel in an end portion of the pixel region therebeneath. In this case, in an output of the pixel region, a subject which should originally appear in an output of the adjacent pixel region would appear as a ghost noise.

Note that this ghost noise can be restrained to a certain extent by the front light shielding body 23 depicted in FIGS. 1A, 1B, and 2, and, further, it may be contemplated to reduce the reflectance of the wall of the light shielding body 23, or to provide a light shielding body similar to the front light shielding body 23 at a lower portion of the light shielding body substrate 20. However, these methods all need processing at the time of manufacturing the light shielding body substrate 20, and, therefore, a ghost noise countermeasure on the sensor substrate side is needed, for example, in the case where an existing light shielding body substrate 20 is used.

The present technology has been made in consideration of the above-mentioned circumstances, and is aimed at making it possible to restrain a ghost noise from appearing in an output of a sensor substrate with a light shielding body substrate stacked on an upper surface thereof.

Solution to Problem

A solid-state imaging device as a first aspect of the present technology includes: a sensor substrate having at least a first pixel region and a second pixel region; and a light shielding body substrate which is stacked on an upper surface of the sensor substrate and has a light shielding body surrounding a plurality of light guide paths, in which the plurality of light guide paths includes at least a first light guide path corresponding to the first pixel region, and a second light guide path corresponding to the second pixel region, a plurality of pixels included in the first pixel region has a light shielding structure based on respective pixel positions in the first pixel region, and a plurality of pixels included in the second pixel region has a light shielding structure based on respective pixel positions in the second pixel region.

Each of the pixels formed in the sensor substrate may have an OCL (on-chip lens) and a PD (photodiode), and an inter-pixel light shielding layer may be formed between the pixels formed in the sensor substrate.

The light shielding structure may be the inter-pixel light shielding layer that partly light-shields the PD.

The light shielding structure may be the OCL which is deviated.

The light shielding structure may be the OCL which is deformed.

The light shielding structure may be the PD which is deviated.

Of the plurality of pixels included in at least one of the first and second pixel regions, the pixels in a center area may not have the light shielding structure.

A wall surface of the light shielding body in the light guide path of the light shielding body substrate may be inclined, and the light shielding structure corresponding to the inclination may be provided.

The sensor substrate may further include a third pixel region corresponding to the light shielding body, and a pixel signal outputted from the pixel included in the third pixel region may not be subjected to signal processing by a logic circuit.

The solid-state imaging device as the first aspect of the present technology may further include a microlens disposed at an incident surface of each light guide path of the light shielding body substrate.

The solid-state imaging device as the first aspect of the present technology may further include a main lens which is disposed on an upper surface of the light shielding body substrate and corresponds to a plurality of the microlenses, in which the light shielding structure corresponding also to image height position of the main lens is provided.

The solid-state imaging device as the first aspect of the present technology may further include: a light guide plate disposed for mounting a subject on an upper surface of the light shielding body substrate; and an irradiation section that irradiates the subject with light through the light guide plate.

An electronic apparatus as a second aspect of the present technology is an electronic apparatus in which a solid-state imaging device is mounted, in which the solid-state imaging device includes: a sensor substrate having at least a first pixel region and a second pixel region; and a light shielding body substrate which is stacked on an upper surface of the sensor substrate and has a light shielding body surrounding a plurality of light guide paths, the plurality of light guide paths including at least a first light guide path corresponding to the first pixel region, and a second light guide path corresponding to the second pixel region, a plurality of pixels included in the first pixel region having a light shielding structure based on respective pixel positions in the first pixel region, and a plurality of pixels included in the second pixel region having a light shielding structure based on respective pixel positions in the second pixel region.

Advantageous Effect of Invention

According to the first and second aspects of the present technology, appearance of a ghost noise can be restrained.

BRIEF DESCRIPTION OF DRAWINGS

FIGS. 4A, 4B, and 4C illustrate figures depicting configuration examples of a pixel in a solid-state imaging device as a first embodiment of the present technology.

FIGS. 5A, 5B, and 5C illustrate figures depicting a configuration example of a pixel in a solid-state imaging device as a second embodiment of the present technology.

FIGS. 6A, 6B, and 6C illustrate figures depicting a configuration example of a pixel in a solid-state imaging device as a third embodiment of the present technology.

FIG. 22 is a block diagram depicting an example of schematic configuration of a vehicle control system.

DESCRIPTION OF EMBODIMENTS

Figure 1A:
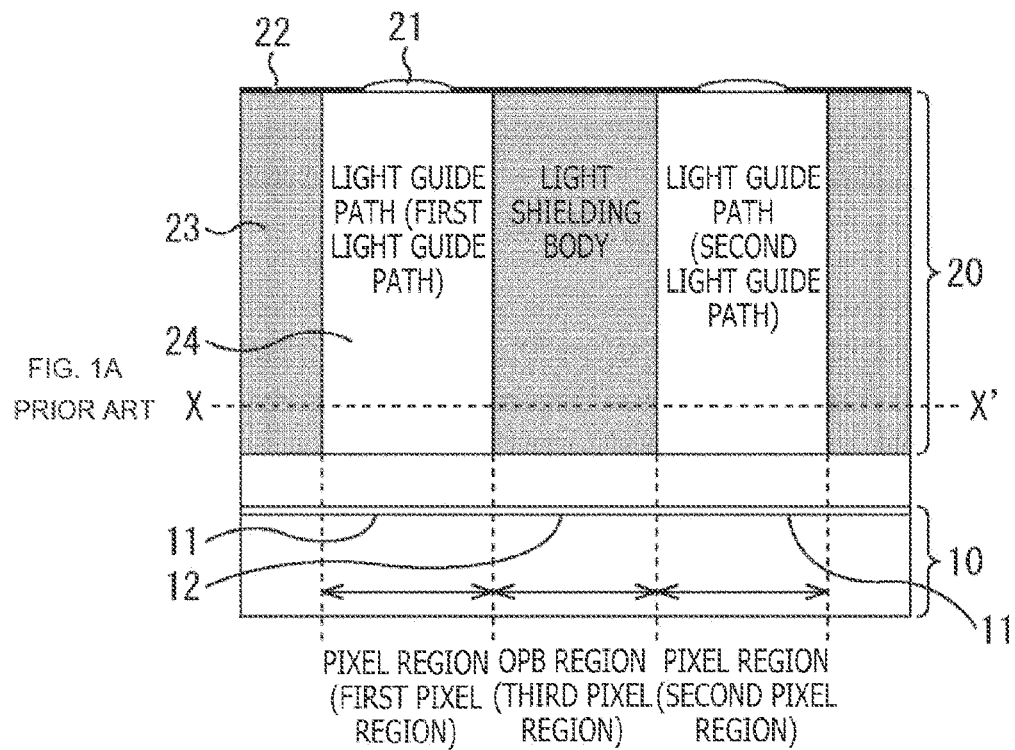
FIGS. 1A and 1B illustrate figures depicting an example of an existing configuration of a solid-state imaging device in which a light shielding body substrate is stacked on a sensor substrate.

Best modes (hereinafter referred to as embodiments) for carrying out the present technology will be described in detail below referring to the drawings, and an outline of the present technology will be described first.

1. Outline of the Present Technology

As aforementioned, the ghost noise appearing in an output of a solid-state imaging device in which a light shielding body substrate is stacked on an upper surface of a sensor substrate is caused by a process in which light from an oblique direction is incident on a light guide path 24, is reflected by a wall of a light shielding body 23, and is received by a pixel in a pixel region therebeneath.

In view of this, in an embodiment of the present technology, a light shielding structure such that light incident on the light guide path 24 of a light shielding body substrate 20 from an oblique direction and reflected by the wall of the light shielding body 23 (the light will hereinafter be referred to as light shielding body wall-reflected light) is not incident is provided, according to the position of each pixel disposed in a pixel region beneath the light guide path 24.

Figure 3:
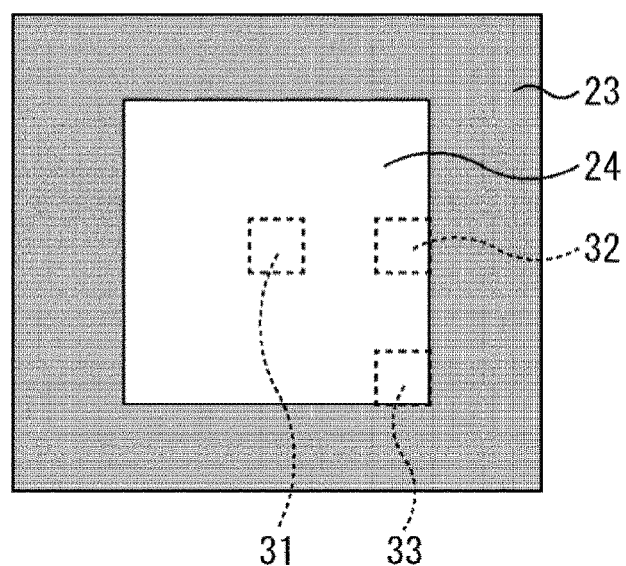
FIG. 3 is a figure depicting a pixel region beneath a light guide path in a light shielding body substrate.

FIG. 3 is a figure for explaining the present technology, and depicts the pixel region beneath the light guide path 24 of the light shielding body substrate 20.

Normally, the light shielding body wall-reflected light is hardly incident on a pixel located in a center area 31 of the pixel region. Therefore, the pixel located in the center area 31 is not provided with the light shielding structure for restraining incidence of the light shielding body wall-reflected light.

The light shielding body wall-reflected light from a wall in one direction may possibly be incident on a pixel located in an edge area 32 of the pixel region. Therefore, the pixel located in the edge area 32 is provided with the light shielding structure for restraining incidence of the light shielding body wall-reflected light from the wall in one direction.

The light shielding body wall-reflected lights from walls in two directions may possibly be incident on a pixel located in a corner area 33 of the pixel region. Therefore, the pixel located in the corner area 33 is provided with the light shielding structure for restraining incidence of the light shielding body wall-reflected lights from the walls in two directions.

2. First Embodiment of the Present Technology

FIGS. 4A, 4B, and 4C depict configuration examples of each pixel of a solid-state imaging device as a first embodiment of the present technology, and depicts configurations in which an inter-pixel light shielding layer deformed correspondingly to the position of each pixel is provided as a light shielding structure for restraining incidence of the light shielding body wall-reflected light.

Figure 1B:
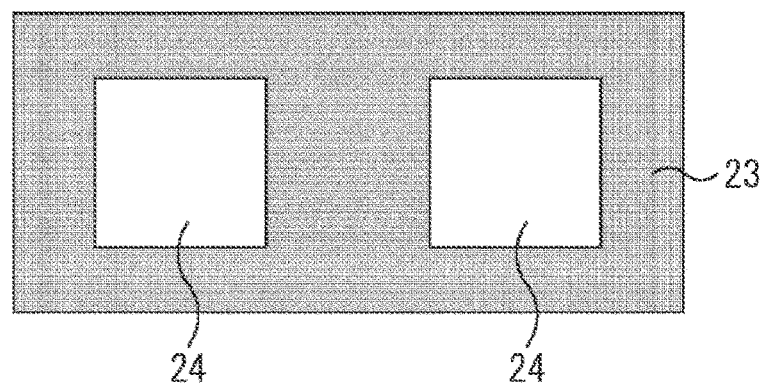
Figure 2:
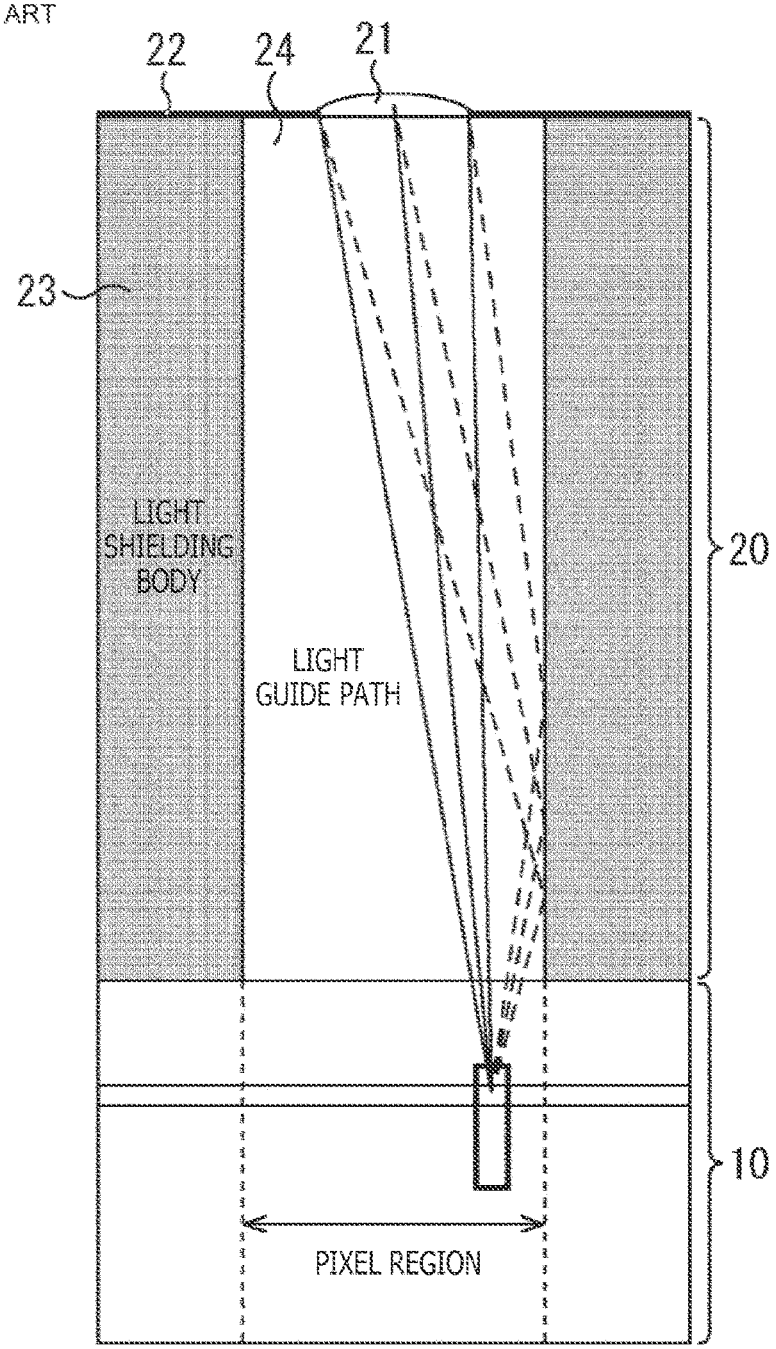
FIG. 2 is a figure depicting an optical path of incident light in the solid-state imaging device of FIGS. 1A and 1B.

Note that the solid-state imaging device as the first embodiment of the present technology has a structure in which the light shielding body substrate 20 is stacked on an upper surface of the sensor substrate 10, similarly to the existing solid-state imaging device depicted in FIGS. 1A and 1B. The sensor substrate 10 of the solid-state imaging device as the first embodiment is formed with, for example, a back side illumination type CMOS image sensor. This applies also to the embodiments described below.

FIG. 4A depicts a vertical sectional view and a horizontal sectional view of a pixel located in the center area 31 of the pixel region.

As aforementioned, the pixel located in the center area 31 of the pixel region is not provided with a light shielding structure. Therefore, the configuration depicted in FIG. 4A indicates a state in which a light shielding structure is not provided.

As depicted in FIG. 4A, the pixel includes an OCL 41, an inter-pixel light shielding layer 42, and a PD 43, in this order from the incidence side. The inter-pixel light shielding layer 42 of the pixel not provided with a light shielding structure is formed without covering the PD 43 therebeneath.

FIG. 4B depicts a vertical sectional view and a horizontal sectional view of a pixel located in the edge area 32 of the pixel region.

As aforementioned, the pixel located in the edge area 32 of the pixel region is provided with a light shielding structure for restraining incidence of the light shielding body wall-reflected light from a wall in one direction. Specifically, an inter-pixel light shielding layer 42 of the pixel located in the edge area 32 is formed to cover one edge on the wall side of the PD 43 therebeneath.

FIG. 4C depicts a vertical sectional view and a horizontal sectional view of a pixel located in the corner area 33 of the pixel region.

As aforementioned, the pixel located in the corner area 33 of the pixel region is provided with a light shielding structure for restraining incidence of the light shielding body wall-reflected light from walls in two directions. Specifically, an inter-pixel light shielding layer 42 of the pixel located in the edge area 32 is formed to cover two edges on the wall side of the PD 43 therebeneath.

In the first embodiment, as the light shielding structure for restraining incidence of the light shielding body wall-reflected light, the inter-pixel light shielding layer 42 is formed correspondingly to the position of each pixel in such a manner as to partly cover the PD 43. As a result, at the pixels located in the edge area 32 and the corner area 33, the incidence of the light shielding body wall-reflected light can be restrained, and, therefore, a ghost noise can be restrained from appearing in the output of the solid-state imaging device.

3. Second Embodiment of the Present Technology

FIGS. 5A, 5B, and 5C depict configuration examples of each pixel of a solid-state imaging device as a second embodiment of the present technology, and depicts a configuration in which an OCL is deviated correspondingly to the position of each pixel, as a light shielding structure for restraining incidence of the light shielding body wall-reflected light.

FIG. 5A depicts a vertical sectional view and a horizontal sectional view of a pixel located in the center area 31 of the pixel region.

As aforementioned, the pixel located in the center area 31 of the pixel region is not provided with a light shielding structure for restraining incidence of the light shielding body wall-reflected light, and, therefore, an OCL 41 of the pixel located in the center area 31 is disposed in the center of the pixel without being deviated.

FIG. 5B depicts a vertical sectional view and a horizontal sectional view of a pixel located in the edge area 32 of the pixel region.

As aforementioned, the pixel located in the edge area 32 of the pixel region is provided with a light shielding structure for restraining incidence of the light shielding body wall-reflected light from a wall in one direction. Specifically, an OCL 41 of the pixel located in the edge area 32 is deviated to a position spaced from the side of the wall in one direction.

FIG. 5C depicts a vertical sectional view and a horizontal sectional view of a pixel located in the corner area 33 of the pixel region.

As aforementioned, the pixel located in the corner area 33 of the pixel region is provided with a light shielding structure for restraining incidence of the light shielding body wall-reflected lights from walls in two direction. Specifically, an OCL 41 of the pixel located in the edge area 32 is deviated to a position spaced from the walls in two directions.

In the second embodiment, as the light shielding structure for restraining incidence of the light shielding body wall-reflected light, the OCL 41 is deviated according to the position of each pixel. As a result, the incidence of the light shielding body wall-reflected light can be restrained, and, therefore, a ghost noise can be restrained from appearing in the output of the solid-state imaging device.

Note that in place of deviating the OCL 41, or in addition to the deviation, the shape of the OCL 41 may be deformed according to the position of the pixel.

4. Third Embodiment of the Present Technology

FIGS. 6A, 6B, and 6C depict configuration examples of each pixel of a solid-state imaging device as a third embodiment of the present technology, and depicts a configuration in which a PD 43 is deviated correspondingly to the position of each pixel, as a light shielding structure for restraining incidence of the light shielding body wall-reflected light.

FIG. 6A depicts a vertical sectional view and a horizontal sectional view of a pixel located in the center area 31 of the pixel region.

As aforementioned, the pixel located in the center area 31 of the pixel region is not provided with a light shielding structure for restraining incidence of the light shielding body wall-reflected light, and, therefore, a PD 43 of the pixel located in the center area 31 is disposed in the center of the pixel without being deviated.

FIG. 6B depicts a vertical sectional view and a horizontal sectional view of a pixel located in the edge area 32 of the pixel region.

As aforementioned, the pixel located in the edge area 32 of the pixel region is provided with a light shielding structure for restraining incidence of the light shielding body wall-reflected light from a wall in one direction. Specifically, the PD 43 of the pixel located in the edge area 32 is disposed in a deviated and reduced state such as to be spaced from the side of the wall in one direction.

FIG. 6C depicts a vertical sectional view and a horizontal sectional view of a pixel located in the corner area 33 of the pixel region.

As aforementioned, the pixel located in the corner area 33 of the pixel region is provided with a light shielding structure for restraining incidence of the light shielding body wall-reflected lights from walls in two directions. Specifically, the PD 43 of the pixel located in the edge area 32 is disposed in a deviated and reduced state such as to be spaced from the walls in two directions.

In the third embodiment, the PD 43 corresponding to the position of each pixel is disposed in a deviated and reduced state, as the light shielding structure for restraining the incidence of the light shielding body wall-reflected light. As a result, the incidence of the light shielding body wall-reflected light can be restrained, and, therefore, a ghost noise can be restrained from appearing in the output of the solid-state imaging device.

Note that the first to third embodiments described above can be appropriately combined with one another.

Figure 7:
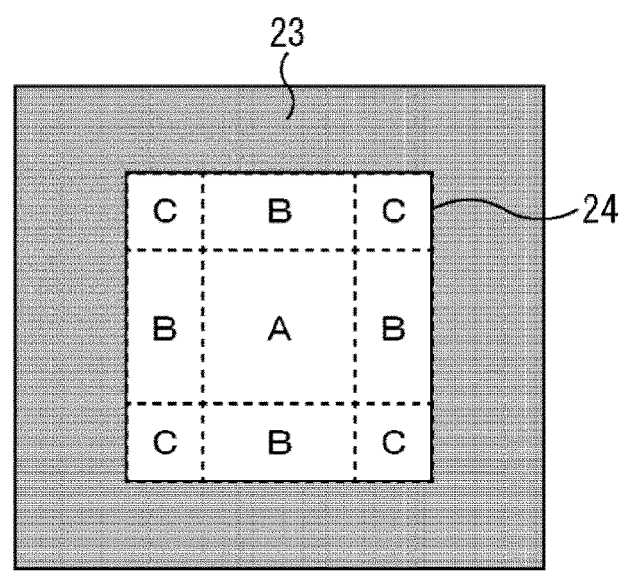
FIG. 7 is a figure depicting a diving method for pixel regions.

FIG. 7 depicts an example of a dividing method for the center area 31, the edge areas 32, and the corner areas 33 in the pixel region beneath the light guide path 24.

For example, as depicted in the figure, it is sufficient that the pixel region beneath the light guide path 24 is divided into nine areas, one area denoted by A is made to be the center area 31, four areas denoted by B are made to be the edge areas 32, four areas denoted by C are made to be the corner areas 33, and the structures of the pixels located at the respective positions are changed.

Note that instead of dividing the pixel region beneath the light guide path 24 into the three kinds, the light shielding amount in restraining the incidence of the light shielding body wall-reflected light may be varied according to the distance from the center.

Figure 8:
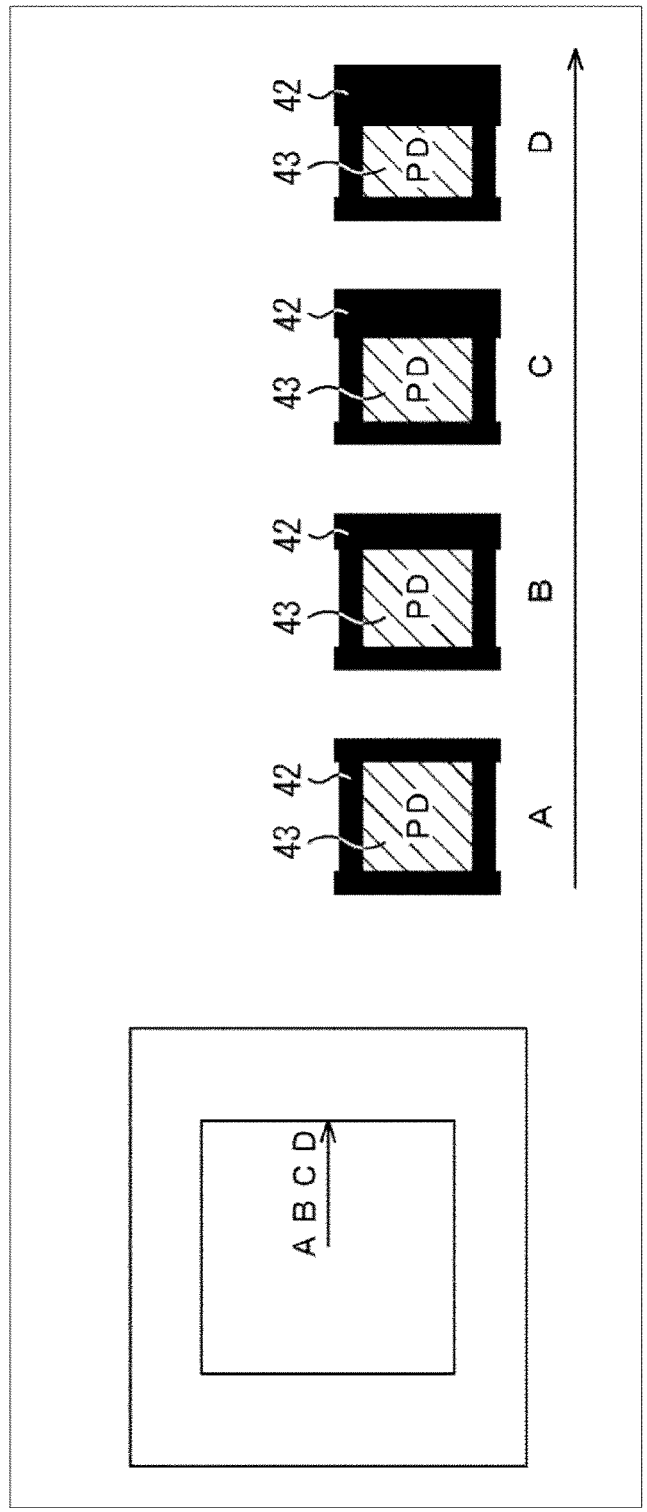
FIG. 8 is a figure depicting a case where a light shielding measure is varied stepwise.

FIG. 8 depicts an example in which the light shielding amount (in the case of the figure, the amount of coverage of the PD 43) in restraining the incidence of the light shielding body wall-reflected light is varied stepwise in four steps, according to the distance from the center of the pixel region beneath the light guide path 24. The number of the steps is arbitrary, and may be less than four, or may be not less than five.

5. Fourth Embodiment of the Present Technology

Figure 9:
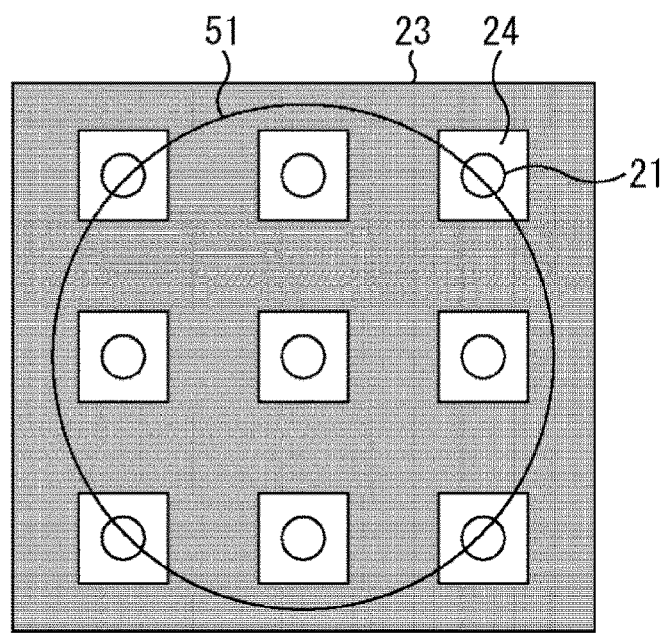
FIG. 9 is a top plan view depicting a configuration example of a light shielding body substrate of a solid-state imaging device as a fourth embodiment of the present technology.

FIG. 9 depicts an upper surface of a light shielding body substrate 20 of a solid-state imaging device as a fourth embodiment of the present technology. The fifth embodiment depicts a configuration in which a large-sized main lens 51 is provided on the upper surface of the light shielding body substrate 20.

In the first to third embodiments described above, the light shielding structure of the pixel in the pixel region beneath each light guide path 24 has been changed according to the position in the pixel region. In the fifth embodiment, the light shielding structure of each pixel is changed according to the position (image height position) of each light guide path 24 in relation to the main lens 51 and the position in the pixel region beneath each light guide path 24. For example, in the light guide path 24 located in the center of the main lens 51, the pixels in the pixel region therebeneath can be deemed as having a common image height position, and, therefore, it suffices to provide the light shielding structure in the first to third embodiments described above.

On the other hand, for example, for the pixels in the pixel region beneath the light guide path 24 on the right upper side in FIG. 9 which is located at an end portion of the main lens 51, the light shielding amount for each pixel is varied according to the image height position of the main lens 51 and the position in the pixel region.

6. Fifth Embodiment of the Present Technology

Figure 10:
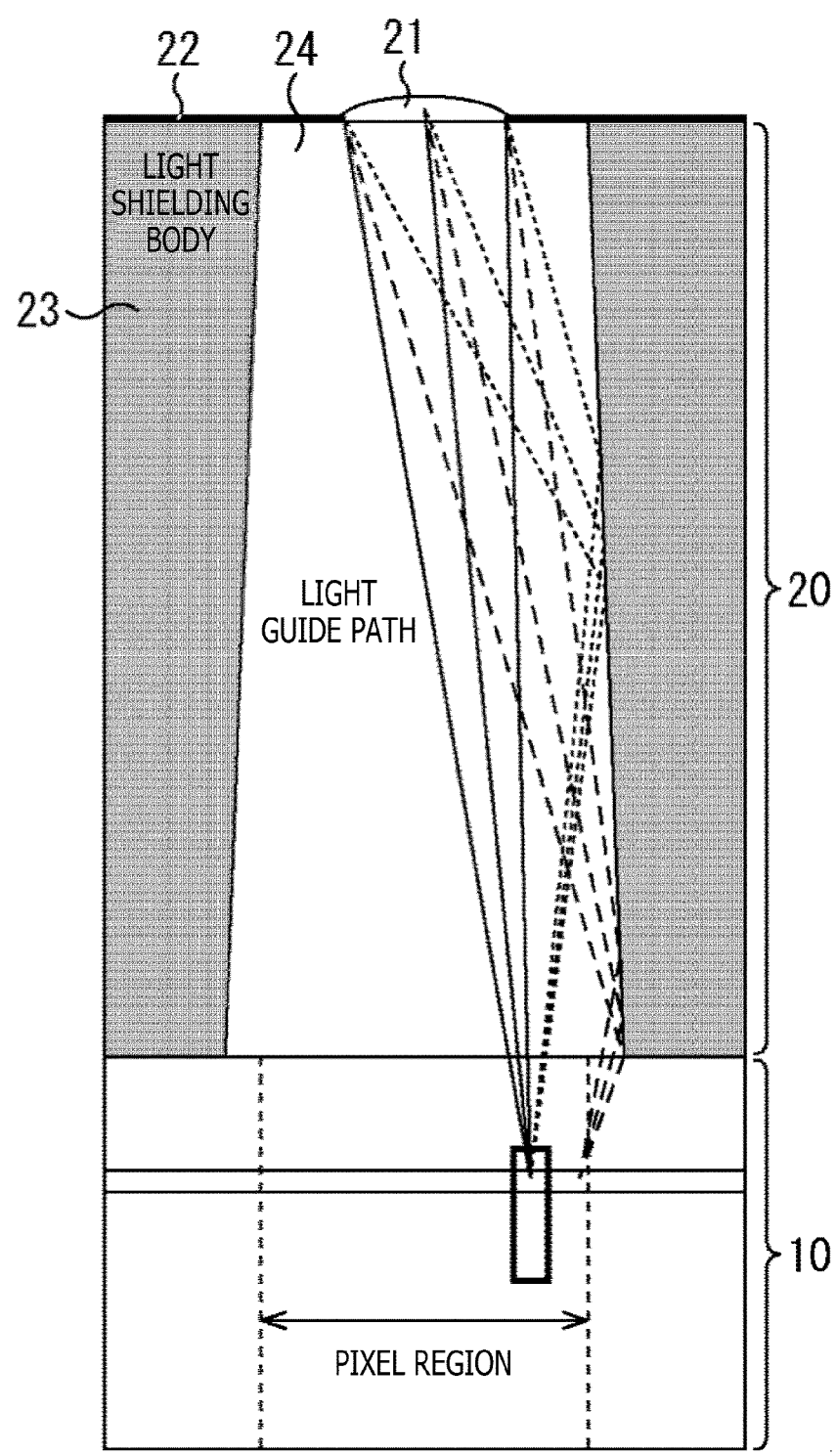
FIG. 10 is a sectional view depicting a configuration example of a light shielding body substrate of a solid-state imaging device as a fifth embodiment of the present technology.

FIG. 10 depicts a section of a light shielding body substrate 20 of a solid-state imaging device as a fifth embodiment of the present technology. As illustrated in the figure, depending on the light shielding body substrate 20, a wall of a light shielding body 23 may be inclined.

In the case where a light guide path 24 becomes broader in going downward as depicted in the figure, the light shielding body wall-reflected light is incident on the pixels located on outer periphery side in the pixel region. In such a case, therefore, only the pixels on the outer periphery side in the pixel region may be provided with a light shielding structure.

7. Utilization Examples of the Present Technology

Figure 11:
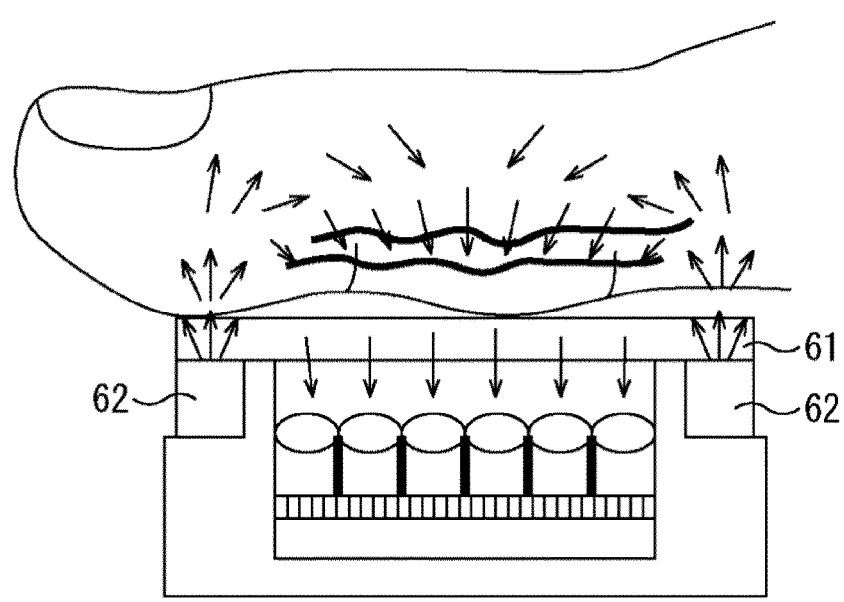
FIG. 11 is a sectional view depicting a configuration example of a fingerprint authentication device to which the present technology is applied.

FIG. 11 depicts a sectional view of a fingerprint authentication device to which the present technology is applied. The fingerprint authentication device is provided with a transparent light guide plate 61 for mounting a subject (in the case of the figure, a finger) thereon at an upper layer of a light shielding body substrate 20, and, at an end portion of the light guide plate 61, there is provided an irradiation section 62 for irradiating the subject with light through the light guide plate 61. In the case where the present technology is applied to the fingerprint authentication device, it is possible to restrain a ghost noise and thereby to enhance the accuracy of fingerprint authentication.

Figure 12:
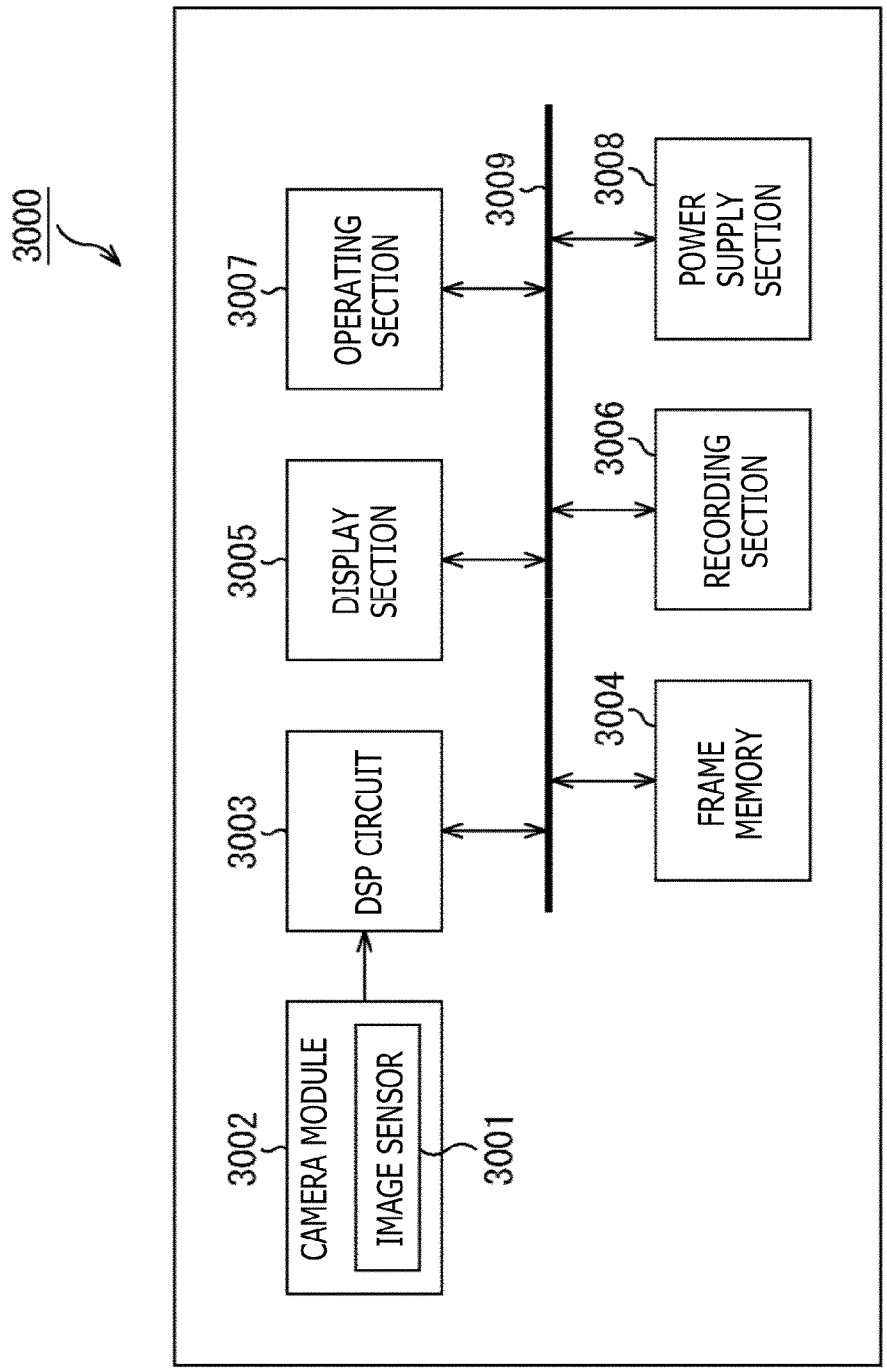
FIG. 12 is a block diagram depicting a configuration example of the imaging device to which the present technology is applied.

FIG. 12 depicts a configuration example of an imaging device to which the present technology is applied. The imaging device 3000 includes a camera module 3002, and a DSP (Digital Signal Processor) circuit 3003 which is a camera signal processing circuit. In addition, the imaging device 3000 also includes a frame memory 3004, a display section 3005, a recording section 3006, an operating section 3007, and a power supply section 3008. The DSP circuit 3003, the frame memory 3004, the display section 3005, the recording section 3006, the operating section 3007, and the power supply section 3008 are interconnected through a bus line 3009.

An image sensor 3001 in the camera module 3002 takes in incident light (image light) from a subject, and converts the light amount of the incident light focused on an imaging surface into an electric signal on a pixel basis, and outputs the electric signal as a pixel signal. The solid-state imaging devices as the first to fifth embodiments of the present technology can be applied to the image sensor 3001.

The display section 3005 includes, for example, a panel-type display device such as a liquid crystal panel and an organic EL (Electro Luminescence) panel, and displays a moving image or a still image picked up by the image sensor 3001. The recording section 3006 records the moving image or still image picked up by the image sensor 3001 into a recording medium such as a hard disk and a semiconductor memory.

The operating section 3007, under an operation by the user, generates operating commands concerning various functions possessed by the imaging device 3000. The power supply section 3008 supplies, as required, various kinds of power supply which serves as operating power supply for the DSP circuit 3003, the frame memory 3004, the display section 3005, the recording section 3006, and the operating section 3007 to these objects to be supplied with power.

Figure 13:
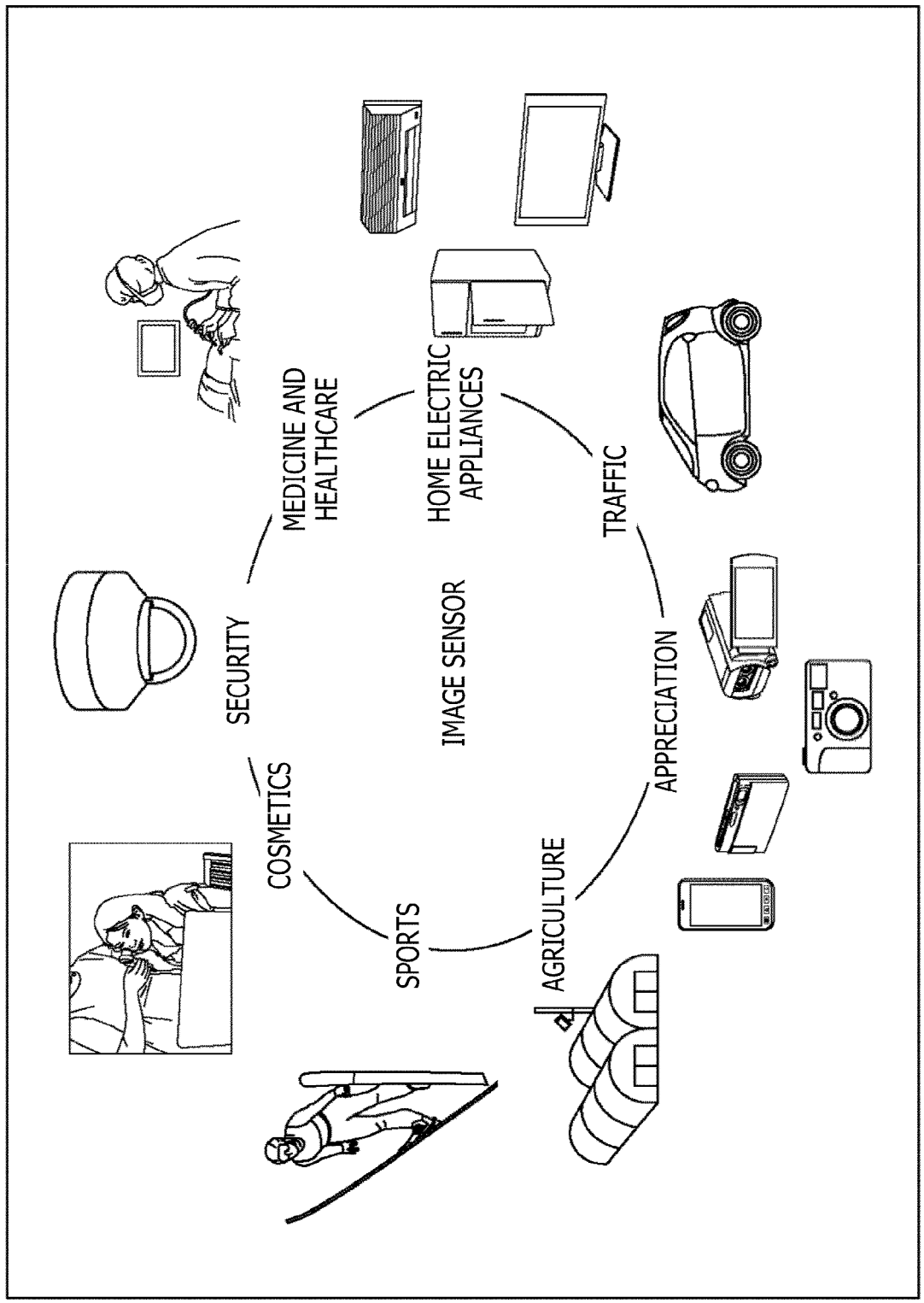
FIG. 13 is a figure for explaining use examples of the imaging device to which the present technology is applied.

FIG. 13 depicts use examples of the imaging device 3000 illustrated in FIG. 12.

The imaging device 3000 can be used, for example, in various cases of sensing light such as visible light, infrared light, ultraviolet light, and X-rays as mentioned below.

Apparatuses that pick up an image for appreciation (viewing) use, such as digital cameras, portable apparatuses equipped with a camera function, etc.

Apparatuses for use in traffic use, such as in-vehicle sensors for imaging the front side, the rear side, the surroundings, the interior, etc. of an automobile for the purpose of safe driving, such as automatic vehicle stop, recognition of the driver's condition, etc., monitor cameras for monitoring the running vehicles and/or the road, distance measuring sensors for measuring distances such as inter-vehicle distance, etc.

Apparatuses for use in home electric appliances such as TVs, refrigerators, and air conditioners for the purpose of imaging a user's gesture and performing an apparatus operation according to the gesture.

Apparatuses for use in medical or healthcare use, such as endoscopes and devices for imaging blood vessels by receiving infrared light.

Apparatuses for security use, such as surveillance camera for crime prevention and cameras for person authentication use.

Apparatuses for cosmetic use, such as skin measuring instrument for imaging a skin and a microscope for imaging the scalp.

Apparatuses for sports use, such as action cameras and wearable cameras for sports use or the like.

Apparatuses for agricultural use, such as cameras for monitoring conditions of fields and/or farm products.

8. Configuration Examples of Stacked-Type Solid-State Imaging Device to which the Technology According to the Present Disclosure can be Applied FIGS. 14A, 14B, and 14C depict figures depicting an outline of configuration example of a stacked-type solid-state imaging device to which the technology according to the present disclosure is applicable.

Figure 14A:
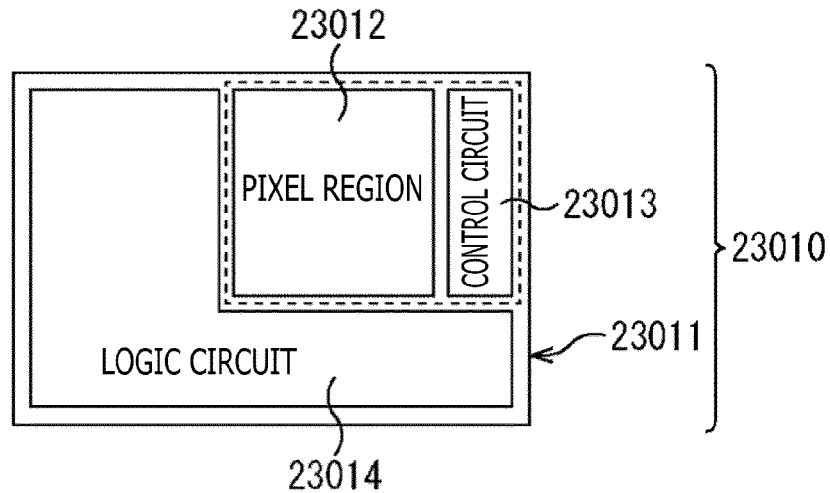
FIGS. 14A, 14B, and 14C illustrate figures depicting the outline of a configuration example of a stacked-type solid-state imaging device to which the technology according to the present disclosure can be applied.

FIG. 14A denotes a schematic configuration example of a non-stacked-type solid-state imaging device. As depicted in FIG. 14A, a solid-state imaging device 23010 has one sheet of die (semiconductor substrate) 23011. A pixel region 23012 in which pixels are arranged in an array, a control circuit 23013 that performs various kinds of control such as driving of pixels, and a logic circuit 23014 for signal processing are mounted on the die 23011.

Figure 14B:
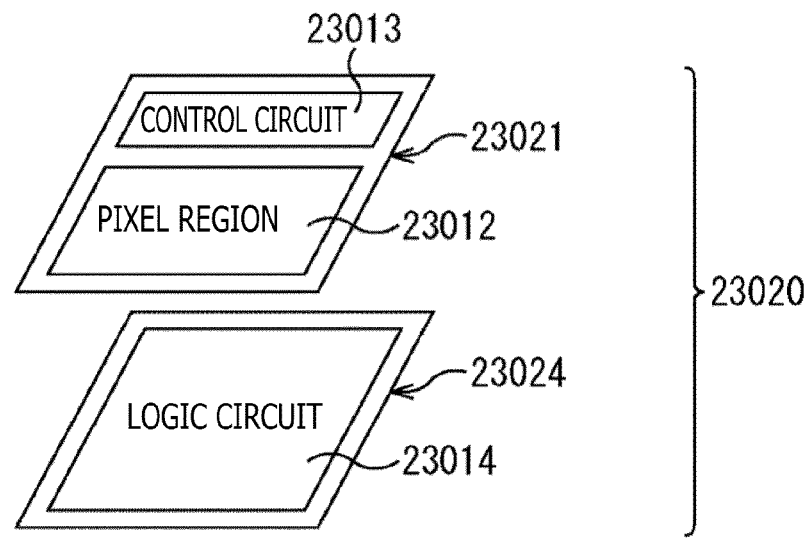
Figure 14C:
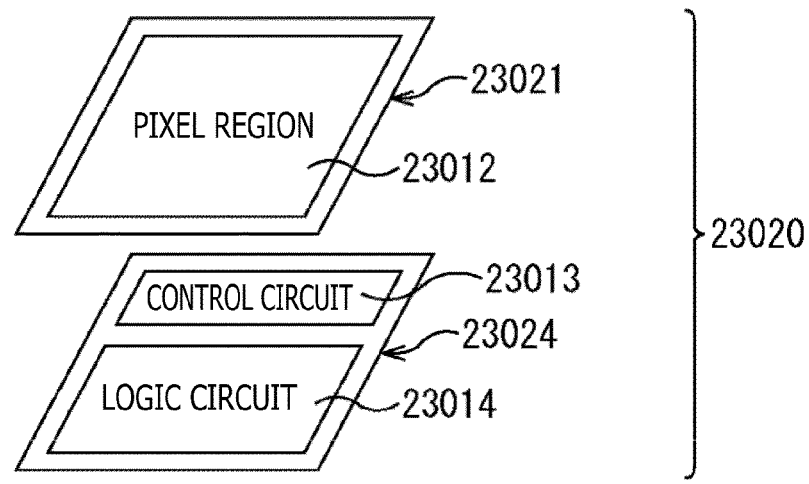

FIGS. 14B and 14C depict schematic configuration examples of a stacked-type solid-state imaging device. As illustrated in FIGS. 14B and 14C, a solid-state imaging device 23020 has a structure in which two sheets of dies, that is, a sensor die 23021 and a logic die 23024 are stacked, and are electrically connected to each other, to configure a single semiconductor chip.

FIG. 14B, a pixel region 23012 and a control circuit 23013 are mounted on the sensor die 23021, while a logic circuit 23014 including a signal processing circuit for performing signal processing is mounted on the logic die 23024.

FIG. 14C, the pixel region 23012 is mounted on the sensor die 23021, while the control circuit 23013 and the logic circuit 23014 are mounted on the logic die 23024.

Figure 15:
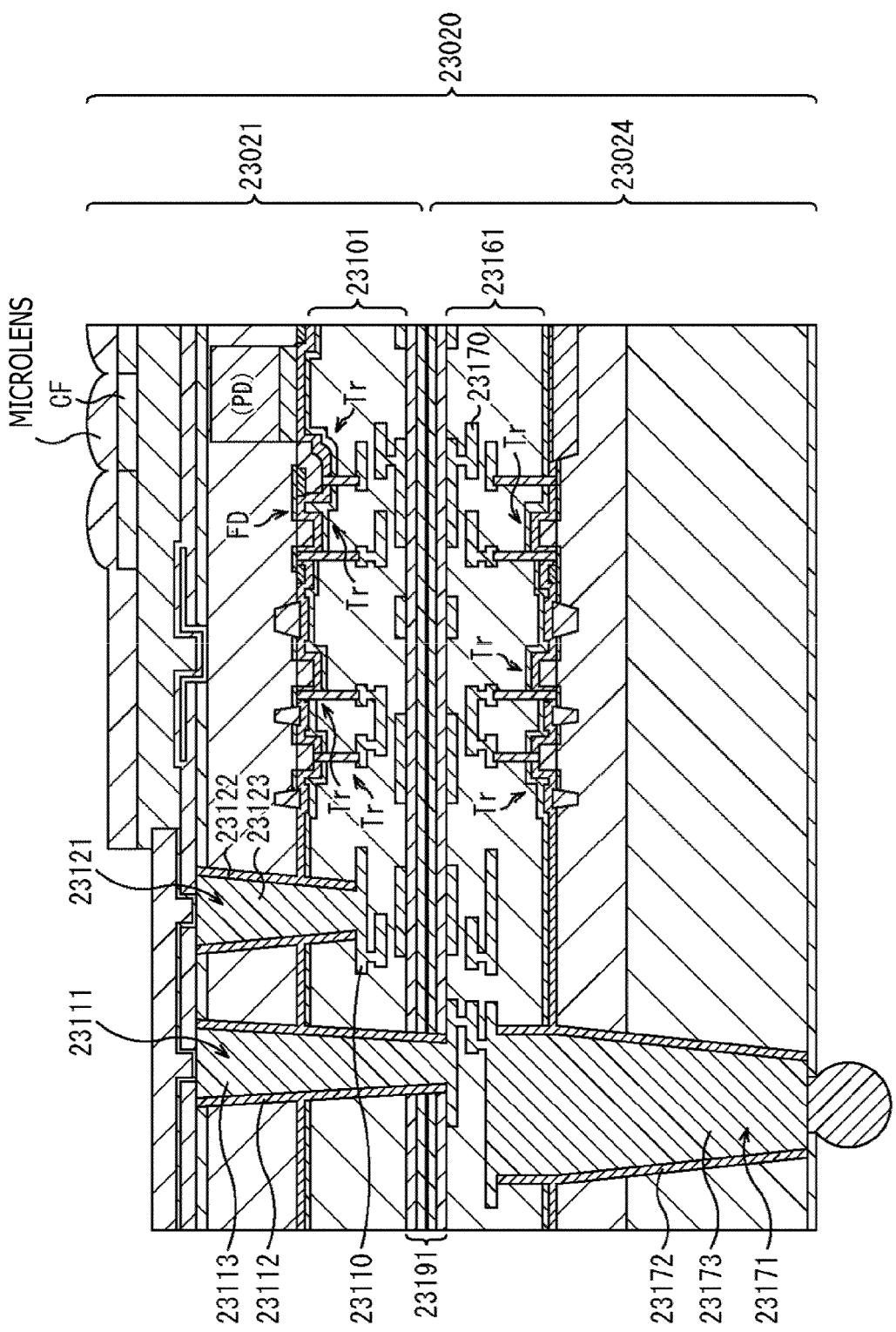
FIG. 15 is a sectional view depicting a first configuration example of a stacked-type solid-state imaging device 23020.

FIG. 15 is a sectional view depicting a first configuration example of the stacked-type solid-state imaging device 23020.

The sensor die 23021 is formed with a PD (photodiode), an FD (floating diffusion), and a Tr (MOS FET) constituting a pixel to constitute the pixel region 23012, and a Tr and the like constituting the control circuit 23013. Further, the sensor die 23021 is formed with a wiring layer 23101 having a plurality of layers, in this example, three layers, of wirings 23110. Note that the control circuit 23013 (or Tr's constituting it) may be configured in the logic die 23024, instead of the sensor die 23021.

The logic die 23024 is formed with Tr's constituting the logic circuit 23014. Further, the logic die 23024 is formed with a wiring layer 23161 having a plurality of layers, in this example, three layers, of wirings 23170. In addition, the logic die 23024 is formed with a connection hole 23171 formed with an insulating film 23172 at an inner wall surface thereof, and a connection conductor 23173 connected to the wirings 23170 and the like is embedded in the connection hole 23171.

The sensor die 23021 and the logic die 23024 have their respective wiring layers 23101 and 23161 faced and adhered to each other, thereby to configure the stacked-type solid-state imaging device 23020 in which the sensor die 23021 and the logic die 23024 are stacked on each other. At the surface at which the sensor die 23021 and the logic die 23024 are adhered together, a film 23191 such as a protective film is formed.

The sensor die 23021 is formed with a connection hole 23111 that penetrates the sensor die 23021 from a back surface side (the side on which light is incident on the PD) of the sensor die 23021 and reaches the uppermost-layer wiring 23170 of the logic die 23024. Further, the sensor die 23021 is formed, adjacently to the connection hole 23111, with a connection hole 23121 that reaches the wiring 23110 in the first layer from the back surface side of the sensor die 23021. An insulating film 23112 is formed at an inner wall surface of the connection hole 23111, and an insulating film 23122 is formed at an inner wall surface of the connection hole 23121. Connection conductors 23113 and 23123 are embedded in the connection holes 23111 and 23121, respectively. The connection conductor 23113 and the connection conductor 23123 are electrically connected to each other on the back surface side of the sensor die 23021, whereby the sensor die 23021 and the logic die 23024 are electrically connected to each other through the wiring layer 23101, the connection hole 23121, the connection hole 23111, and the wiring layer 23161.

Figure 16:
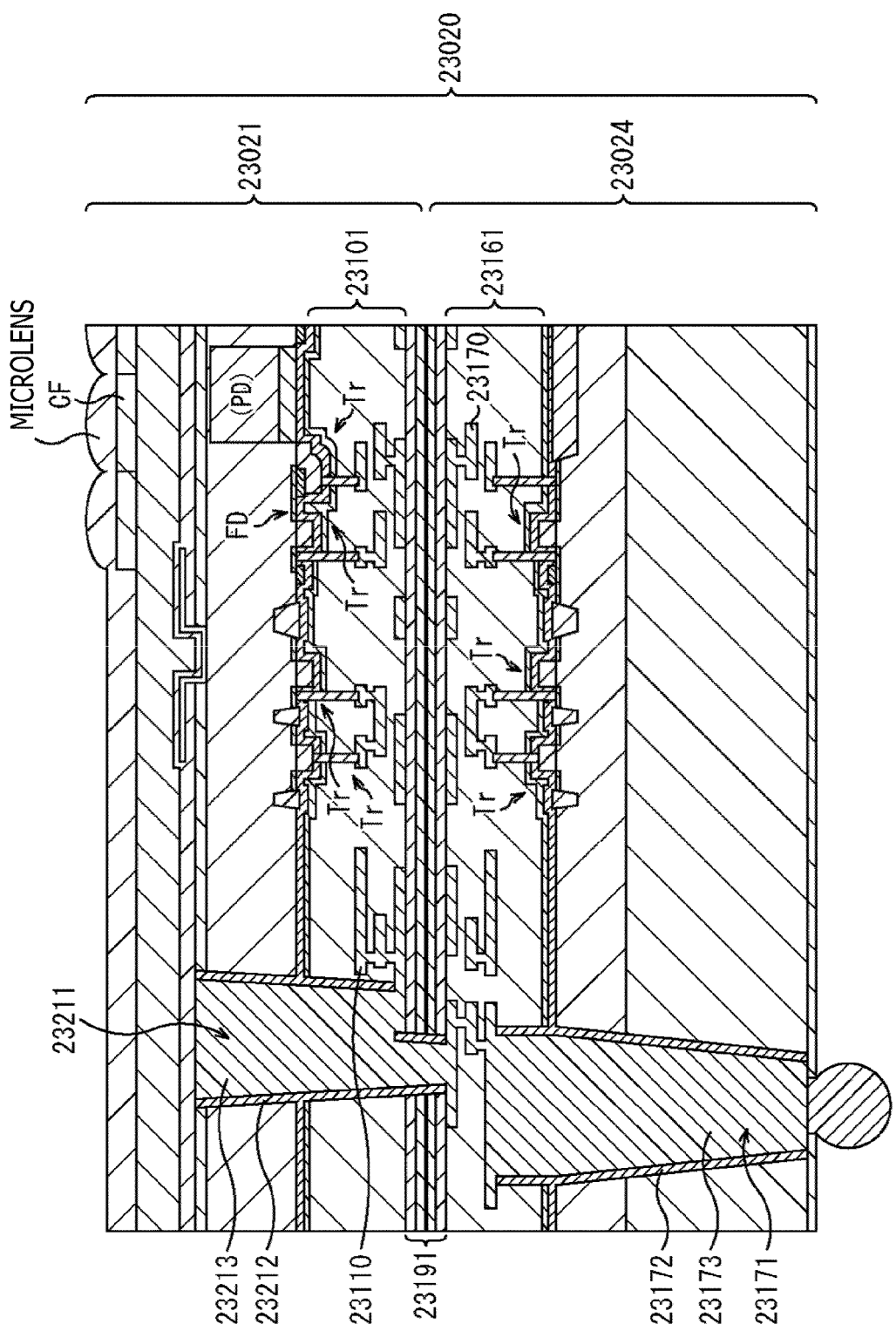
FIG. 16 is a sectional view depicting a second configuration example of the stacked-type solid-state imaging device 23020.

FIG. 16 is a sectional view depicting a second configuration example of the stacked-type solid-state imaging device 23020.

In the second configuration example of the solid-state imaging device 23020, the sensor die 23021 (or the wiring layer 23101 thereof (or the wiring 23110 thereof)) and the logic die 23024 (or the wiring layer 23161 thereof (or the wiring 23170 thereof)) are electrically connected to each other by a connection hole 23211 formed in the sensor die 23021.

Specifically, in FIG. 16, the connection hole 23211 penetrates the sensor die 23021 from the back surface side of the sensor die 23021, reaches the uppermost-layer wiring 23170 of the logic die 23024 and reaches the uppermost-layer wiring 23110 of the sensor die 23021. An insulating film 23212 is formed at an inner wall surface of the connection hole 23211, and a connection conductor 23213 is embedded in the connection hole 23211. While the sensor die 23021 and the logic die 23024 are electrically connected to each other by the two connection holes 23111 and 23121 in FIG. 15 above, the sensor die 23021 and the logic die 23024 are electrically connected to each other by the one connection hole 23211 in FIG. 16.

Figure 17:
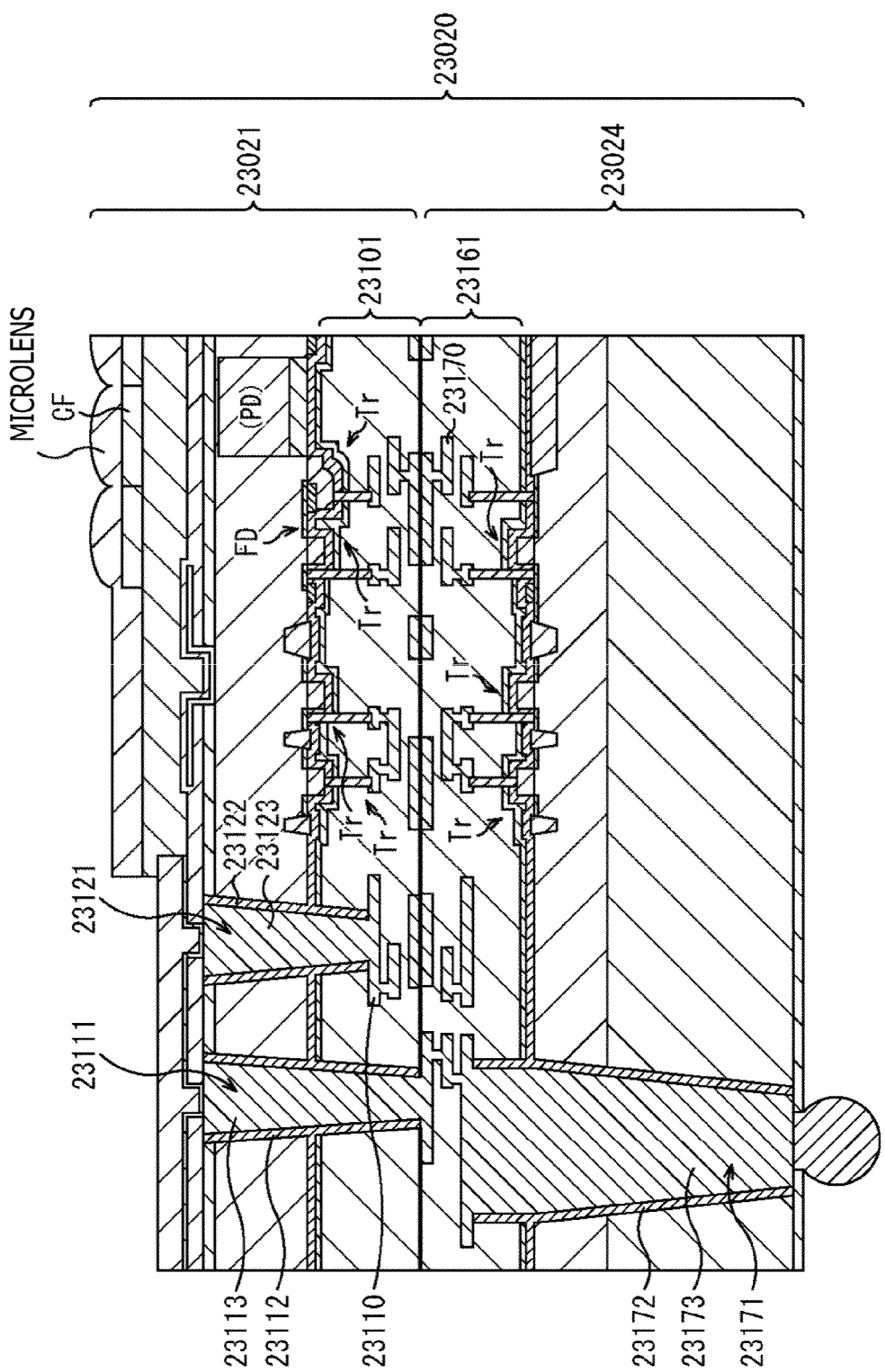
FIG. 17 is a sectional view depicting a third configuration example of the stacked-type solid-state imaging device 23020.

FIG. 17 is a sectional view depicting a third configuration example of the stacked-type solid-state imaging device 23020.

The solid-state imaging device 23020 in FIG. 17 differs from the case of FIG. 15 in which the film 23191 such as a protective film is formed at the surface at which the sensor die 23021 and the logic die 23024 are adhered to each other, in that a film 23191 such as a protective film is not formed at the surface at which the sensor die 23021 and the logic die 23024 are adhered to each other.

The solid-state imaging device 23020 of FIG. 17 is configured by a process in which the sensor die 23021 and the logic die 23024 are laid on each other such that the wirings 23110 and 23170 make direct contact with each other, and heating is conducted while exerting a required load, to directly join the wirings 23110 and 23170 to each other.

Figure 18:
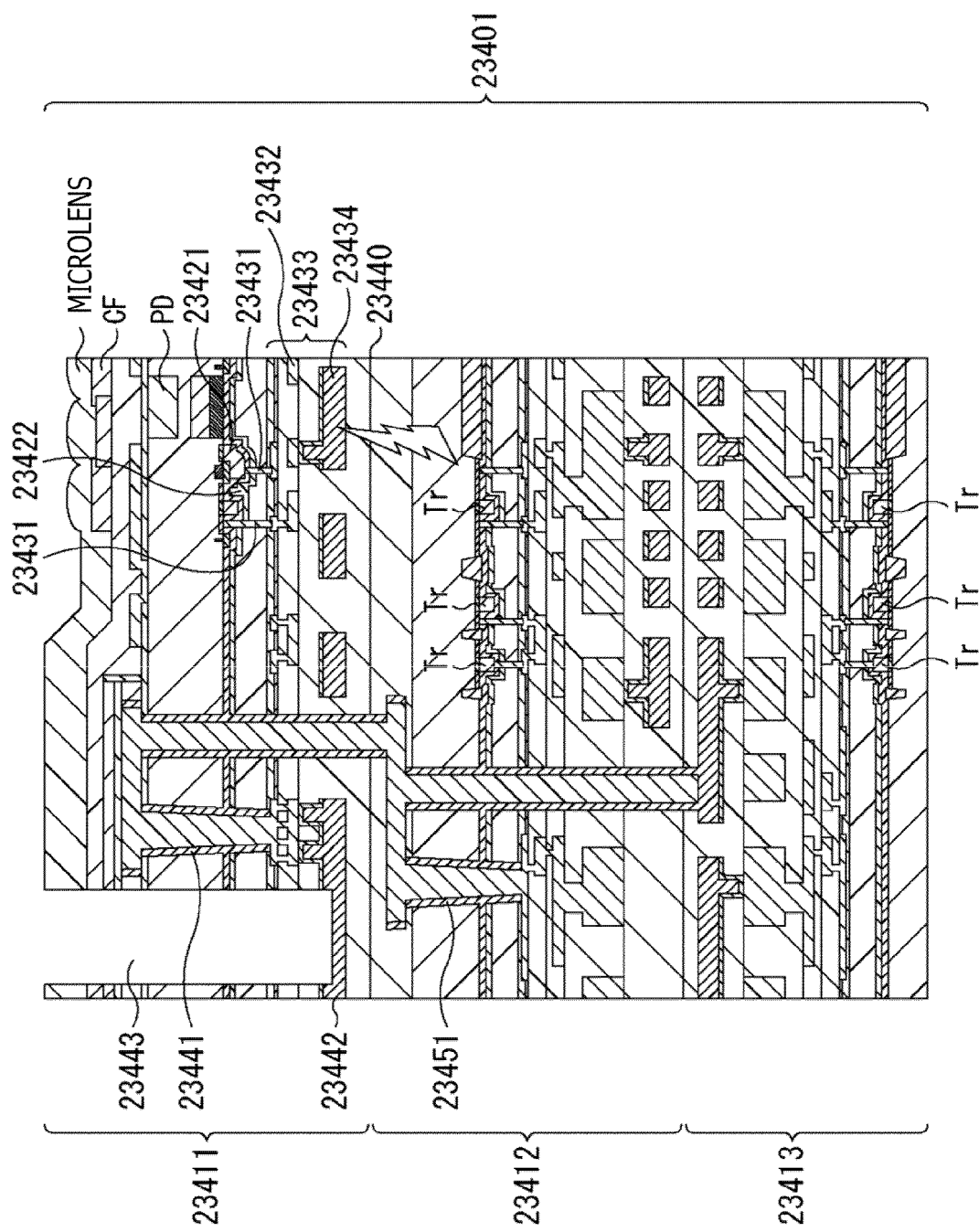
FIG. 18 is a sectional view depicting other configuration example of the stacked-type solid-state imaging device to which the technology according to the present disclosure can be applied.

FIG. 18 is a sectional view depicting other configuration example of the stacked-type solid-state imaging device to which the technology according to the present disclosure can be applied.

In FIG. 18, the solid-state imaging device 23401 has a three-layer stacked structure in which three layers of dies consisting of a sensor die 23411, a logic die 23412, and a memory die 23413 are stacked together.

The memory die 23413 has, for example, a memory circuit that stores data required momentarily in the signal processing performed in the logic die 23412.

While the logic die 23412 and the memory die 23413 are stacked in this order under the sensor die 23411 in FIG. 18, the logic die 23412 and the memory die 23413 may be stacked in the reverse order, namely, in the order of the memory die 23413 and the logic die 23412, under the sensor die 23411.

Note that in FIG. 18, the sensor die 23411 is formed with a PD constituting a photoelectric conversion section of a pixel, and source/drain regions of a pixel Tr.

A gate electrode is formed in the surroundings of the PD through a gate insulating film, and the gate electrode and the pair of source/drain regions form a pixel TR 23421 and a pixel Tr 23422.

The pixel Tr 23421 adjacent to the PD is a transfer Tr, and one of the pair of source/drain regions constituting the pixel Tr 23421 is an FD.

In addition, the sensor die 23411 is formed with an interlayer insulating film, and the interlayer insulating film is formed with connection holes. Connection conductors 23431 connected to the pixel Tr 23421 and the pixel Tr 23422 are formed in the connection holes.

Further, the sensor die 23411 is formed with a wiring layer 23433 having a plurality of layers of wirings 23432 which is connected to each of the connection conductors 23431.

In addition, an aluminum pad 23434 serving as an electrode for external connection is formed in the lowermost layer of the wiring layer 23433 of the sensor die 23411. Specifically, in the sensor die 23411, the aluminum pad 23434 is formed at a position nearer to an adhesion surface 23440 for adhesion to the logic die 23412 than to the wiring 23432. The aluminum pad 23434 is used as one end of a wiring concerning input/output of a signal from or to the exterior.

Further, the sensor die 23411 is formed with a contact 23441 used for electrical connection with the logic die 23412. The contact 23441 is connected to a contact 23451 of the logic die 23412, and is connected also to an aluminum pad 23442 of the sensor die 23411.

The sensor die 23411 is formed with a pad hole 23443 such as to reach the aluminum pad 23442 from the back surface side (upper side) of the sensor die 23411.

The technology according to the present disclosure is applicable to the above-mentioned solid-state imaging devices.

9. Application Examples to In-Vivo Information Acquisition System

The technology according to the present disclosure (the present technology) is applicable to various products. For example, the technology according to the present disclosure may be applied to an endoscopic surgery system.

Figure 19:
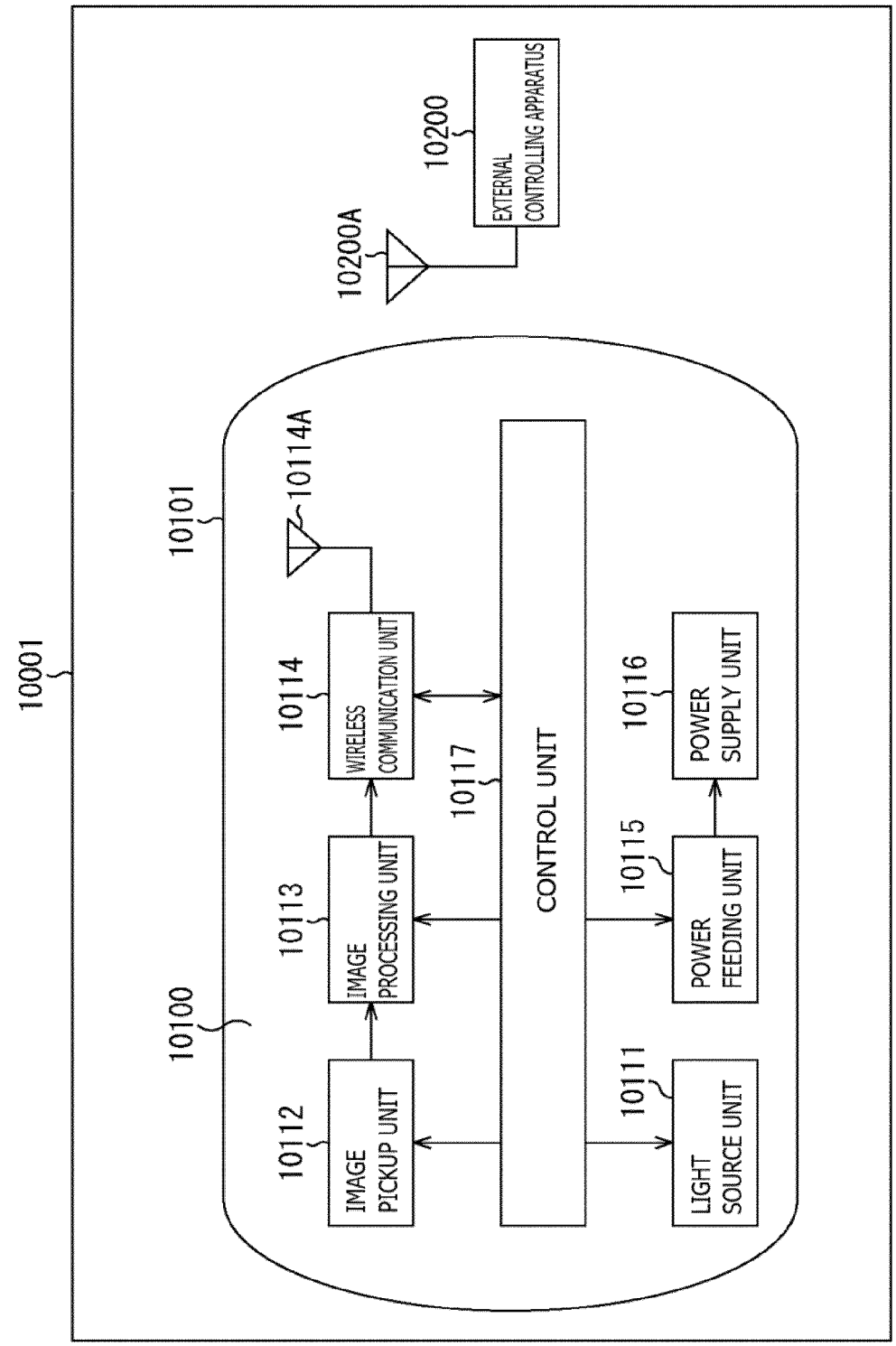
FIG. 19 is a block diagram depicting an example of a schematic configuration of an in-vivo information acquisition system.

FIG. 19 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 19, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

Thus, an example of the in-vivo information acquisition system to which the technology according to the present disclosure is applicable has been described above. The technology according to the present disclosure is applicable, for example, to the image pickup unit 10112, of the configuration described above.

10. Application Example to Endoscopic Surgery System

The technology according to the present disclosure (the present technology) is applicable to various products. For example, the technology according to the present disclosure may be applied to an endoscopic surgery system.

Figure 20:
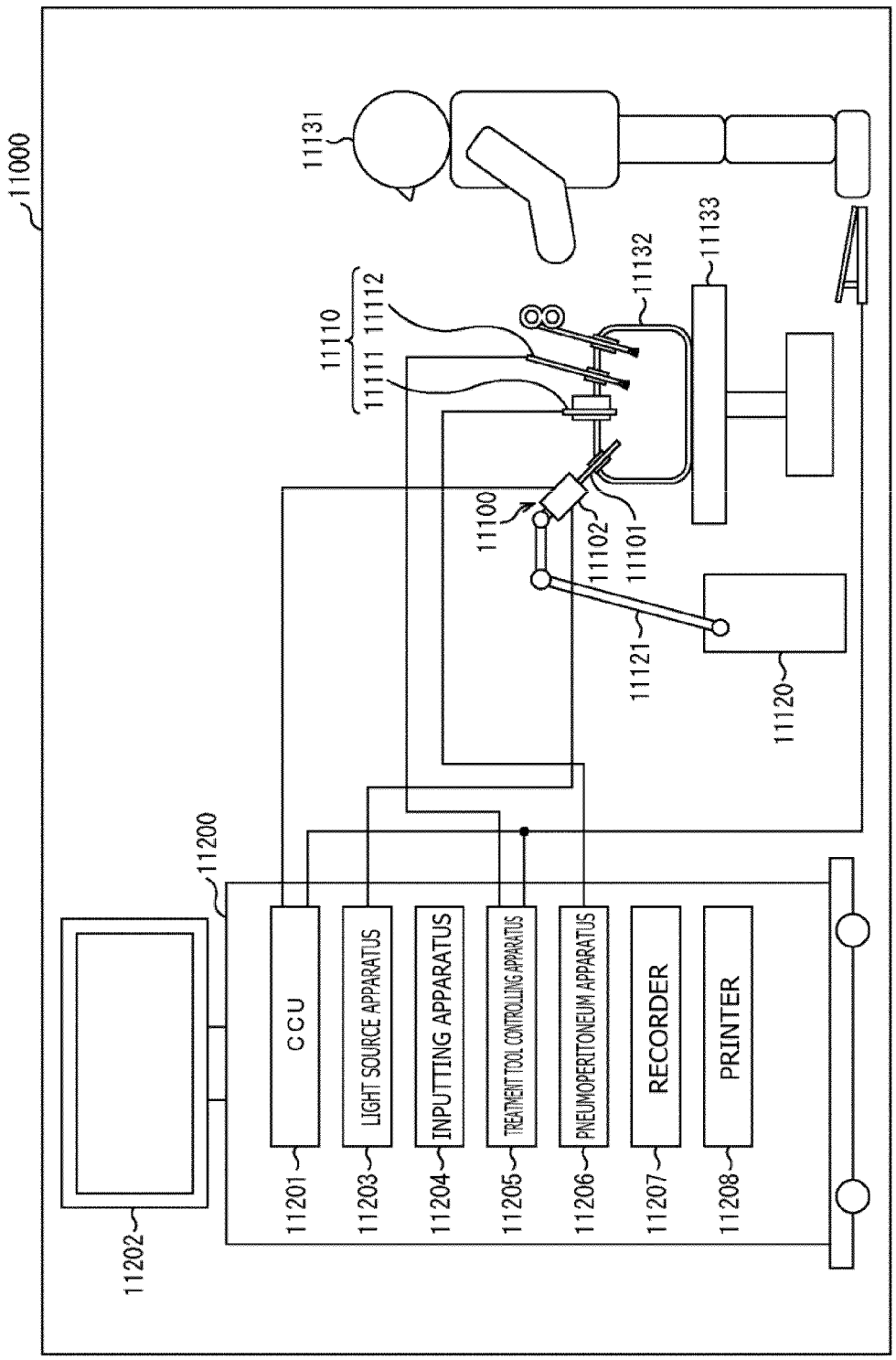
FIG. 20 is a view depicting an example of a schematic configuration of an endoscopic surgery system.

FIG. 20 is a view depicting an example of a schematic configuration of an endoscopic surgery system to which the technology according to an embodiment of the present disclosure (present technology) can be applied.

In FIG. 20, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 21:
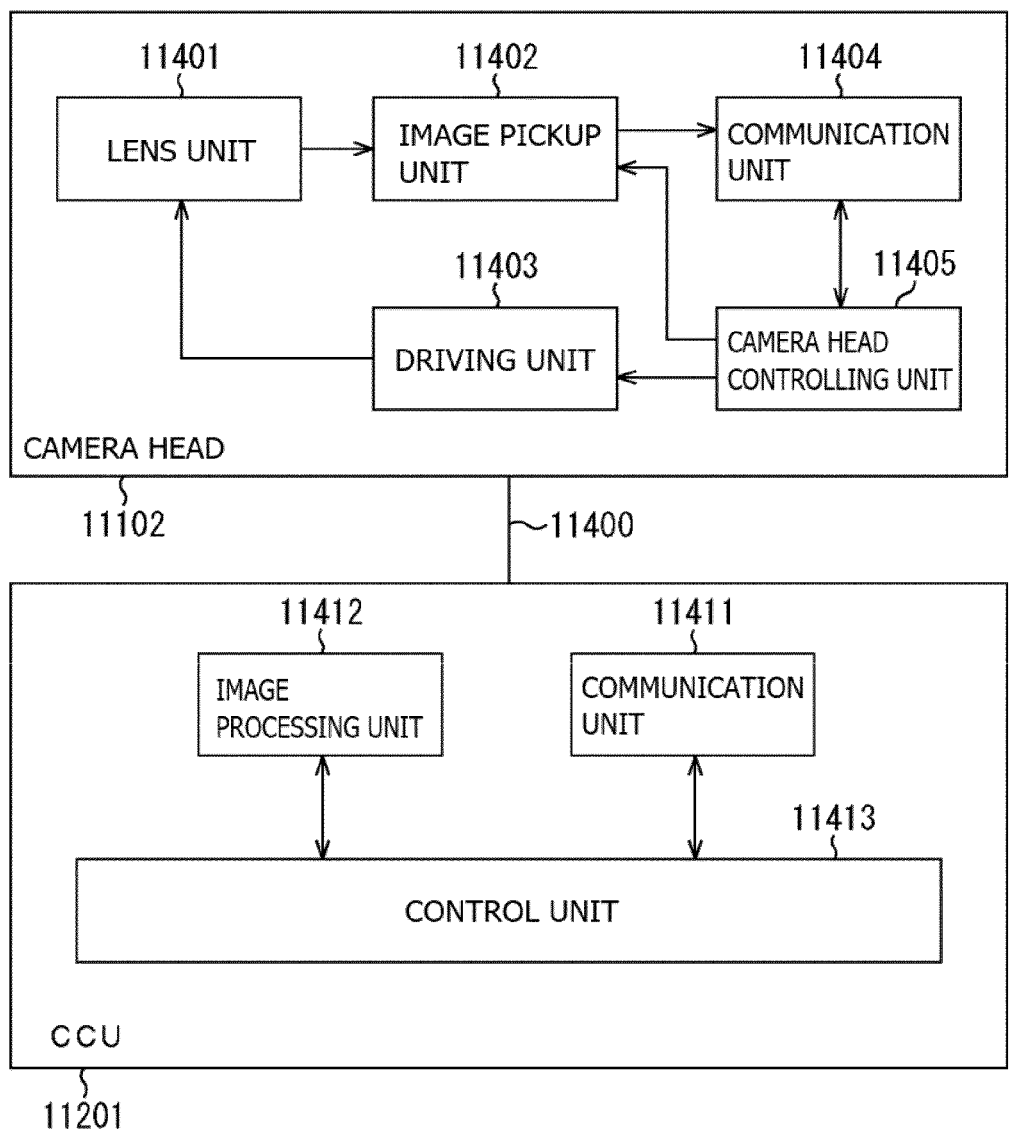
FIG. 21 is a block diagram depicting an example of a functional configuration of a camera head and a camera control unit (CCU).

FIG. 21 is a block diagram depicting an example of a functional configuration of the camera head 11102 and the CCU 11201 depicted in FIG. 20.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

Thus, an example of the endoscopic surgery system to which the technology according to the present disclosure is applicable has been described above. The technology according to the present disclosure is applicable, for example, to the image pickup unit 11402 of the camera head 11102.

Note that while the endoscopic surgery system has been described as an example here, the technology according to the present disclosure may be applied, for example, to a microscopic surgery system.

10. Application Example to Mobile Body

The technology according to the present disclosure (the present technology) is applicable to various products. For example, the technology according to the present disclosure may be realized as an apparatus mounted on any type of mobile body such as an automobile, an electric vehicle, a hybrid electric vehicle, a motorcycle, a bicycle, a personal mobility, an airplane, a drone, a ship, or a robot.

FIG. 22 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 22, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 22, an audio speaker 12061, a display section 12062, and an instrument panel 12063 are illustrated as the output device. The display section 12062 may, for example, include at least one of an on-board display and a head-up display.

Figure 23:
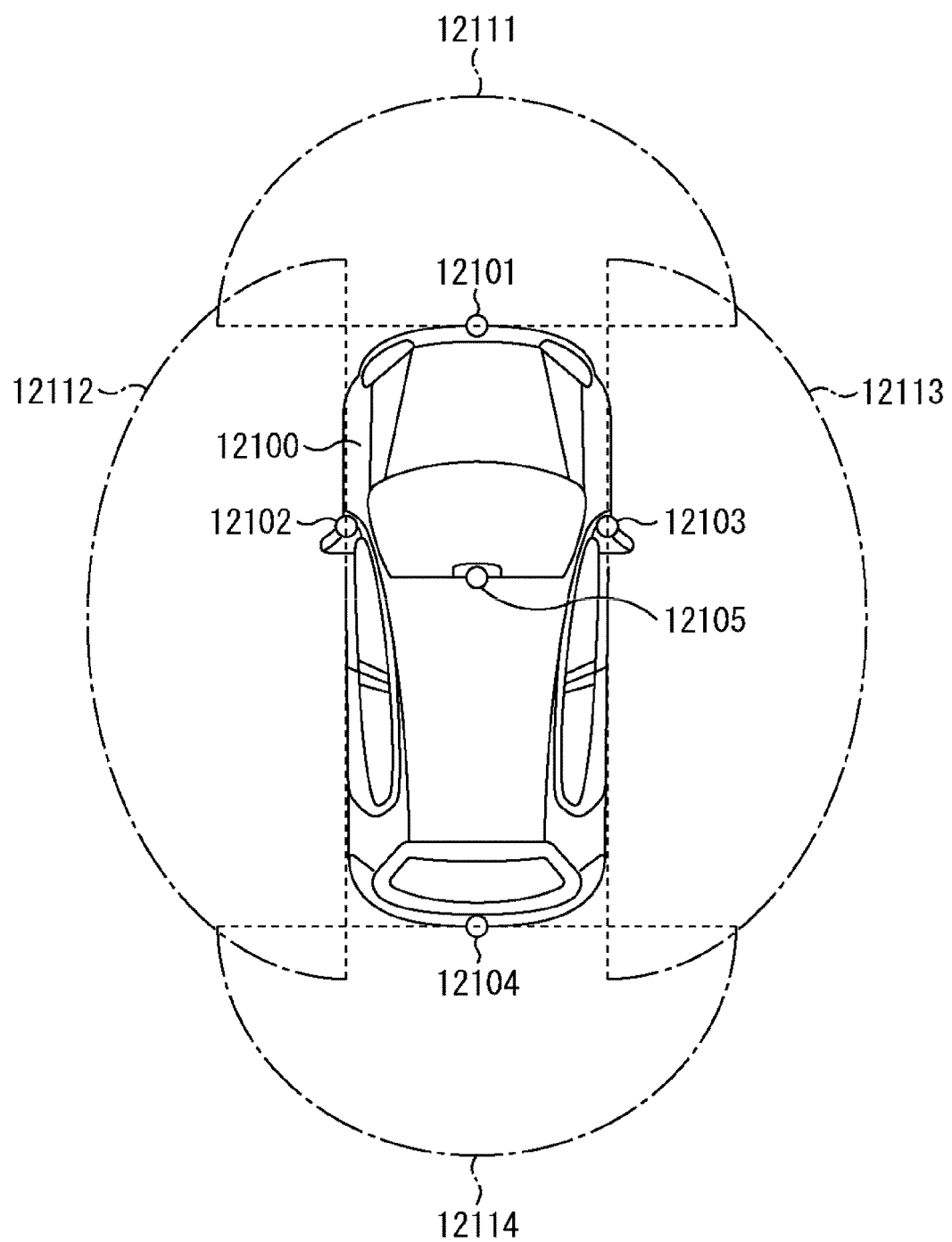
FIG. 23 is a diagram of assistance in explaining an example of installation positions of an outside-vehicle information detecting section and an imaging section.

FIG. 23 is a diagram depicting an example of the installation position of the imaging section 12031.

In FIG. 23, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 23 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Thus, an example of the vehicle control system to which the technology according to the present disclosure is applicable has been described above. The technology according to the present disclosure is applicable, for example, to the imaging section 12031, of the configuration described above.

Note that the embodiment of the present technology is not limited to the above-described embodiments, and various modifications are possible without departing from the scope of the gist of the present technology.

The present technology can take the following configurations.

(1)
A solid-state imaging device including:
a sensor substrate having at least a first pixel region and a second pixel region; and
a light shielding body substrate which is stacked on an upper surface of the sensor substrate and has a light shielding body surrounding a plurality of light guide paths,
in which the plurality of light guide paths includes at least a first light guide path corresponding to the first pixel region, and a second light guide path corresponding to the second pixel region,
a plurality of pixels included in the first pixel region has a light shielding structure based on respective pixel positions in the first pixel region, and
a plurality of pixels included in the second pixel region has a light shielding structure based on respective pixel positions in the second pixel region.

(2)
The solid-state imaging device as described in the above paragraph (1),
in which each of the pixels formed in the sensor substrate has an OCL (on-chip lens) and a PD (photodiode), and
an inter-pixel light shielding layer is formed between the pixels formed in the sensor substrate.

(3)
The solid-state imaging device as described in the above paragraph (2),
in which the light shielding structure includes the inter-pixel light shielding layer that partly light-shields the PD.

(4)
The solid-state imaging device as described in the above paragraph (2),
in which the light shielding structure includes the OCL which is deviated.

(5)
The solid-state imaging device as described in the above paragraph (2),
in which the light shielding structure includes the OCL which is deformed.

(6)
The solid-state imaging device as described in the above paragraph (2),
in which the light shielding structure includes the PD which is deviated.

(7)
The solid-state imaging device as described in any one of the above paragraphs (1) to (6),
in which of the plurality of pixels included in at least one of the first and second pixel regions, the pixels in a center area do not have the light shielding structure.

(8)
The solid-state imaging device as described in any one of the above paragraphs (1) to (7),
in which a wall surface of the light shielding body in the light guide path of the light shielding body substrate is inclined, and
the light shielding structure corresponding to the inclination is provided.

(9)
The solid-state imaging device as described in any one of the above paragraphs (1) to (8),
in which the sensor substrate further includes a third pixel region corresponding to the light shielding body, and
a pixel signal outputted from the pixel included in the third pixel region is not subjected to signal processing by a logic circuit.

(10)
The solid-state imaging device as described in any one of the above paragraphs (1) to (9), further including:
a microlens disposed at an incident surface of each light guide path of the light shielding body substrate.

(11)
The solid-state imaging device as described in the above paragraph (10), further including:
a main lens which is disposed on an upper surface of the light shielding body substrate and corresponds to a plurality of the microlenses,
in which the light shielding structure corresponding also to an image height position of the main lens is provided.

(12)
The solid-state imaging device as described in any one of the above paragraphs (1) to (11), further including:
a light guide plate disposed for mounting a subject on an upper surface of the light shielding body substrate; and
an irradiation section that irradiate the subject with light through the light guide plate.

(13)
An electronic apparatus in which a solid-state imaging device is mounted,
in which the solid-state imaging device includes:
a sensor substrate having at least a first pixel region and a second pixel region; and
a light shielding body substrate which is stacked on an upper surface of the sensor substrate and has a light shielding body surrounding a plurality of light guide paths,
the plurality of light guide paths including at least a first light guide path corresponding to the first pixel region, and a second light guide path corresponding to the second pixel region,
a plurality of pixels included in the first pixel region having a light shielding structure based on respective pixel positions in the first pixel region,
a plurality of pixels included in the second pixel region having a light shielding structure based on respective pixel positions in the second pixel region.

REFERENCE SIGNS LIST

10 Sensor substrate, 20 Light shielding body substrate, 21 Microlens, 22 Front light shielding body, 23 Light shielding body, 24 Light guide path, 31 Center area, 32 Edge area, 33 Corner area, 41 OCL, 42 Inter-pixel light shielding layer, 43 PD, 51 Main lens, 61 Light guide plate, 62 Irradiation section

The invention claimed is:

1. A solid-state imaging device, comprising:
a sensor substrate that includes a first pixel region and a second pixel region; and
a light shielding body substrate on an upper surface of the sensor substrate, wherein
the light shielding body substrate has a light shielding body surrounding a plurality of light guide paths,
the plurality of light guide paths includes at least:
a first light guide path corresponding to the first pixel region, and
a second light guide path corresponding to the second pixel region,
the first pixel region includes a first plurality of pixels,
each pixel of the first plurality of pixels in the first pixel region has a first light shielding structure based on a respective pixel position of each pixel of the first plurality of pixels in the first pixel region, the second pixel region includes a second plurality of pixels, and each pixel of the second plurality of pixels in the second pixel region has a second light shielding structure based on a respective pixel position of each pixel of the second plurality of pixels in the second pixel region.

2. The solid-state imaging device according to claim 1, wherein each pixel of the first plurality of pixels and the second plurality of pixels in the sensor substrate has an on-chip-lens (OCL) and a photodiode (PD), and the sensor substrate further includes an inter-pixel light shielding layer between the first plurality of pixels.

3. The solid-state imaging device according to claim 2, wherein the first light shielding structure includes the inter-pixel light shielding layer that partly light-shields the PD in the first plurality of pixels.

4. The solid-state imaging device according to claim 2, wherein the first light shielding structure includes the OCL, and a position of the OCL in the first light shielding structure is deviated from a position of a corresponding pixel of the first plurality of pixels.

5. The solid-state imaging device according to claim 2, wherein the first light shielding structure includes the OCL which is deformed.

6. The solid-state imaging device according to claim 2, wherein the first light shielding structure includes the PD, and a position of the PD in the first light shielding structure is deviated from a position of a corresponding pixel of the first plurality of pixels.

7. The solid-state imaging device according to claim 2, wherein at least one of:
  a first set of pixels in a center area of the first pixel region does not have the first light shielding structure, or
  a second set of pixels in a center area of the second pixel region does not have the second light shielding structure,
the first set of pixels is different from the first plurality of pixels, and
the second set of pixels is different from the second plurality of pixels.

8. The solid-state imaging device according to claim 2, wherein a wall surface of the light shielding body in the first light guide path of the light shielding body substrate is inclined, and the first light shielding structure corresponds to the inclination.

9. The solid-state imaging device according to claim 1, wherein the sensor substrate further includes a third pixel region corresponding to the light shielding body, the third pixel region includes a specific pixel configured to output a pixel signal, and the pixel signal output from the specific pixel in the third pixel region is not subjected to a signal process by a logic circuit.

10. The solid-state imaging device according to claim 1, further comprising:

a microlens on an incident surface of each light guide path of the plurality of light guide paths of the light shielding body substrate.

11. The solid-state imaging device according to claim 10, further comprising a main lens on an upper surface of the light shielding body substrate, wherein the main lens corresponds to a plurality of microlenses, and the first light shielding structure corresponds to an image height position of the main lens.

12. The solid-state imaging device according to claim 1, further comprising:

a light guide plate on which a subject is mountable, wherein the light guide plate is on an upper surface of the light shielding body substrate; and an irradiation section configured to irradiate the subject with light through the light guide plate.

13. An electronic apparatus, comprising:

a solid-state imaging device that includes:

a sensor substrate that includes a first pixel region and a second pixel region; and a light shielding body substrate on an upper surface of the sensor substrate, wherein the light shielding body substrate has a light shielding body surrounding a plurality of light guide paths, the plurality of light guide paths including at least:

a first light guide path corresponding to the first pixel region, and a second light guide path corresponding to the second pixel region, the first pixel region includes a first plurality of pixels, each pixel of the first plurality of pixels in the first pixel region has a first light shielding structure based on a respective pixel position of each pixel of the first plurality of pixels in the first pixel region, the second pixel region includes a second plurality of pixels, and each pixel of the second plurality of pixels in the second pixel region has a second light shielding structure based on a respective pixel position of each pixel of the second plurality of pixels in the second pixel region.

* * * * *